United States Patent [19]
Honda

[11] Patent Number: 5,495,120
[45] Date of Patent: Feb. 27, 1996

[54] SEMICONDUCTOR DEVICE HAVING BIPOLAR TRANSISTOR AND MOS TRANSISTOR WITH PARTICULAR CONCENTRATIONS

[75] Inventor: Hiroki Honda, Hyogo, Japan

[73] Assignee: Mitsubishi Denki Kabushiki Kaisha, Tokyo, Japan

[21] Appl. No.: 329,754

[22] Filed: Oct. 26, 1994

[30] Foreign Application Priority Data

Dec. 20, 1993 [JP] Japan .................................. 5-320357

[51] Int. Cl.⁶ ........................... H01L 29/76; H01L 29/94
[52] U.S. Cl. ........................................ 257/370; 257/378
[58] Field of Search ................................ 257/370, 378, 257/557, 526, 577, 371

[56] References Cited

U.S. PATENT DOCUMENTS

| | | | |
|---|---|---|---|
| 4,514,747 | 4/1985 | Miyata et al. | 257/135 |
| 4,717,686 | 1/1988 | Jacobs et al. | 257/370 |
| 5,059,549 | 10/1991 | Furuhata | 257/370 |
| 5,286,991 | 2/1994 | Hui et al. | 257/370 |

OTHER PUBLICATIONS

"High Performance 1.0 um N–Well CMOS/Bipolar Technology", H. Momose et al., Symposium on VLSI Technology Sep. 1983.

"A 1.0 um N–Well CMOS/Bipolar Technology for VLSI Cicuits", J. Miyamoto et al., IEDM Digest of Technical Papers, Dec. 1983.

"High Speed BICMOS VLSI Technology With Buried Twin Well Structure", J. Watanabe et al., EIDM 85.

"High–Speed Bipolar Transistor Compatible With High–Speed CMOS FET Technology", H. Iwasaki et al., Toshiba Review 1985.

"0.8 um BI–CMOS Technology With $f_T$ Ion–Implanted Emitter Bipolar Transistor", H. Iwai et al, IEDM 87.

Primary Examiner—Wael M. Fahmy
Attorney, Agent, or Firm—Lowe, Price, LeBlanc & Becker

[57] ABSTRACT

In a semiconductor device having a bipolar transistor including, on a main surface of a semiconductor substrate, the bipolar transistor and an impurity region of a conductivity type which is different from that of a base region of this bipolar transistor, an impurity for forming the base region is implanted into the entire main surface of a semiconductor substrate to form the base region. Accordingly, the manufacturing costs can be reduced without degrading the performance of the device.

8 Claims, 19 Drawing Sheets

1

SEMICONDUCTOR DEVICE HAVING BIPOLAR TRANSISTOR AND MOS TRANSISTOR WITH PARTICULAR CONCENTRATIONS

BACKGROUND OF THE INVENTION

1. Field of the Invention

The present invention relates to a semiconductor device having a bipolar transistor such as BiMOS (bipolar-Metal Oxide Semiconductor), and to a method of manufacturing the same.

2. Description of the Background Art

Conventionally, a BiMOS has been known in which bipolar and MOS devices are formed on the same substrate so as to utilize advantages of both devices. An example of a circuit including this BiMOS is shown in FIG. 29, which is an equivalent circuit diagram illustrating an example of a circuit including a conventional BiNMOS.

Referring to FIG. 29, provided in the above-mentioned circuit including a BiNMOS are a p channel MOS transistor Q1, an n channel MOS transistor Q2, an npn bipolar transistor Q4, and an n channel MOS transistor Q3.

One impurity region of p channel MOS transistor Q1 is connected to a power supply Vcc. Gate electrode of this p channel MOS transistor Q1 is connected to an input terminal IN.

One impurity region of n channel MOS transistor Q2 is connected to the other impurity region of the p channel MOS transistor Q1. The other impurity region of this n channel MOS transistor Q2 is connected to the ground. Gate electrode of this n channel MOS transistor Q2 is also connected to the input terminal IN.

Collector region of the npn bipolar transistor Q4 is connected to the power supply Vcc. Base region of the npn bipolar transistor Q4 is connected to the other impurity region of the p channel MOS transistor Q1 and one impurity region of the n channel MOS transistor Q2. Emitter region of the npn bipolar transistor Q4 is connected to an external output terminal OUT.

One impurity region of the n channel MOS transistor Q3 is connected to the external output terminal OUT. The other impurity region of the n channel MOS transistor Q3 is connected to the ground. Gate electrode of the n channel MOS transistor Q3 is connected to the input terminal IN.

Operation of the circuit including the above-described BiNMOS is as follows. Example of High level potential being applied to the input terminal IN will be described first. When a High level potential is applied to the input terminal IN, the p channel MOS transistor Q1 will be turned off. The n channel MOS transistor Q2 will be turned on. This would turn npn bipolar transistor Q4 off, while causing the n channel MOS transistor Q3 to be turned on. Thus, the potential of the output terminal OUT is decreased and a Low level potential will be output.

The operation when Low level potential is applied to the input terminal IN is as follows. When a Low level potential is applied to the input terminal IN, p channel MOS transistor Q1 turns on, and n channel MOS transistor Q2 turns off. This would turn npn bipolar transistor Q4 on while causing n channel MOS transistor Q3 to be turned off. Accordingly, current flows through the npn bipolar transistor Q4 to the external output terminal OUT, thus increasing its potential. This means that a High level potential is output.

Referring to FIGS. 30 to 38, a cross sectional structure of the circuit shown in FIG. 29 will be described in detail. FIGS. 30 to 38 show cross sectional structure corresponding to portion 100 of FIG. 29.

Referring to FIG. 30, n channel MOS transistor Q3 and npn bipolar transistor Q4 are formed respectively on a main surface of a p type semiconductor substrate 101. N channel MOS transistor Q3 has n type impurity regions 109, 109 which are to be source/drain regions, and a gate electrode 102. Concentration of this n type impurity regions 109, 109 is about $10^{19}$ cm$^{-3}$ to about $10^{20}$ cm$^{-3}$. Npn bipolar transistor Q4 has an n type collector region 104, a p type base region 105, and an n type emitter region 106.

Beneath the collector region 104, an n type floating collector region 108 is formed, partially overlapping this collector region 104. Also, at collector region 104, an n type collector wall region 107 is formed under the region where a collector electrode is formed. The concentration of the collector wall region 107 is about $10^{19}$ cm$^{-3}$ to about $10^{20}$ cm$^{-3}$. This collector wall region 107 together with the floating collector region 108 serves to reduce the resistance of the current flowing through npn bipolar transistor Q4.

In an element isolation region at the main surface of p type semiconductor substrate 101, an isolation insulating film 110 is formed selectively. Also formed on the main surface of the p type semiconductor substrate 101 are gate insulating film 111 and interlayer insulating film 112. In interlayer insulating film 112, contact holes 128a, 128b, 128c, 128d and 128e are formed, at regions positioned above the impurity regions 109 which are to be source/drain regions of the n channel MOS transistor Q3, and above base region 105, emitter region 106, and collector wall region 107, respectively.

In these contact holes 128a to 128e, metal electrodes 113a, 113b, 113c, 113d, and 113e are formed, respectively. Material of this metal electrodes 113a to 113e may be aluminum (Al) or the like.

Method of manufacturing the BiNMOS shown in FIG. 30 will now be described. FIGS. 31 to 38 are cross sectional views illustrating the first to eighth steps in the manufacturing process of BiNMOS shown in FIG. 30.

Referring first to FIG. 31, resist is applied on the main surface of p type semiconductor substrate 101. Then, the resist is patterned by photolithography to form a resist pattern 115 exposing the region where a collector is to be formed. Using this resist pattern 115 as a mask, an n type impurity such as phosphorus (P) is implanted into the main surface of p type semiconductor substrate 101 thereby forming the collector region 104. Resist pattern 115 is then removed.

Referring now to FIG. 32, resist is applied on the main surface of p type semiconductor substrate 101. The resist is patterned by photolithography to form a resist pattern 116 partially exposing the surface of the collector region 104. Using this resist pattern 116 as a mask, the n type impurity such as phosphorus (P) is implanted into the main surface of p type semiconductor substrate 101 thereby forming the floating collector region 108.

Referring now to FIG. 33, after removing the above-mentioned resist pattern 116, isolation insulating film 110 is formed selectively on the predetermined regions of the main surface of p type semiconductor substrate 101, using LOCOS (Local Oxidation of Silicon) method. Gate oxide film 111 is formed.

Resist is then applied again on the p type semiconductor substrate 101, and is patterned by photolithography. This forms a resist pattern 117 on the main surface of p type semiconductor substrate 101, exposing the region where the collector wall region 107 is to be formed. Using this resist pattern 117 as a mask, the n type impurity such as phosphorus (P) is implanted into the main surface of p type semiconductor substrate 101 with a predetermined energy, thereby forming the collector wall region 107. Resist pattern 117 is then removed.

Referring now to FIG. 34, a polycrystalline silicon layer is deposited entirely on the main surface of p type semiconductor substrate 101 by, for example, CVD (Chemical Vapor Deposition). By patterning this polycrystalline silicon layer, gate electrode 102 of n channel MOS transistor Q3 is formed.

Referring now to FIG. 35, resist is applied again on the main surface of p type semiconductor substrate 101. The resist is patterned by photolithography to form a resist pattern 118 exposing the region where n channel transistor Q3 is to be formed.

Using this resist pattern 118 and gate electrode 102 as masks, an n type impurity such as arsenic (As) is implanted into the main surface of p type semiconductor substrate 101, thereby forming impurity regions 109, 109 which will be source/drain regions of n channel MOS transistor Q3. Resist pattern 118 is then removed.

Referring now to FIG. 36, resist is applied again on the main surface of p type semiconductor substrate 101. The resist is patterned by photolithography to form a resist pattern 119 on the main surface of p type semiconductor substrate 101, exposing gate oxide film 111 on the surface of base region 105. Using this resist pattern 119 as a mask, a p type impurity such as boron (B) is implanted into the main surface of p type semiconductor substrate 101, thereby forming base region 105. Resist pattern 119 is then removed.

Referring now to FIG. 37, resist is applied again on the main surface of p type semiconductor substrate 101. The resist is patterned by photolithography to form a resist pattern 120 on the main surface of p type semiconductor substrate 101, exposing gate oxide film 111 positioned above emitter region 106. Using this resist pattern 120 as a mask, the n type impurity such as arsenic (As) is implanted into the main surface of p type semiconductor substrate 101, thereby forming the emitter region 106. Resist pattern 120 is then removed.

Referring now to FIG. 38, interlayer insulating film 112 consisting of silicon oxide film and the like is formed entirely on the main surface of p type semiconductor substrate 101. Then, contact holes 128a, 128b, 128c, 128d, and 128e are formed at regions positioned above impurity regions 109 of the n channel MOS transistor Q3, base region 105, emitter region 106 and collector wall region 107, respectively, by photolithography and etching.

Referring now to FIG. 30, a metal layer such as aluminum (Al) is deposited in contact holes 128a, 128b, 128c, 128d, and 128e, and above interlayer insulating film 112. By patterning this metal layer to a predetermined shape, metal electrodes 113a, 113b, 113c, 113d, and 113e are formed, respectively. Through the process described above, the structure shown in FIG. 30 is obtained.

However, there has been the following problem in the BiNMOS manufacturing process described above. That is, the BiNMOS includes many impurity regions of different types of conductivity, such as the p type base region 105 and the n type collector region 104. Having many impurity regions of different conductivity types requires formation of many resist patterns 115, 116, 117, 118, 119, and 120 when those regions are formed, which function as mask layers. Conventionally, this has been generally considered inevitable in order to prevent bad influence on the performance of the device, which bad influence was caused by impurities with different types of conductivity being introduced to regions other than predetermined regions.

As a result, many processes of photolithography have been required in order to form many resist patterns as discussed above. The process of photolithography includes various steps such as resist application, mask alignment, exposure, development and inspection. The increased number of such processes which involves many steps inevitably leads to the problem of increased manufacturing costs.

SUMMARY OF THE INVENTION

The present invention was made to solve such problems as described above. It is an object of the present invention to provide a method of manufacturing a semiconductor device having a bipolar transistor which enables reduction of manufacturing costs without degrading performance of the device, and a semiconductor device having a bipolar transistor thereby.

In accordance with one aspect of the semiconductor device having a bipolar transistor of the present invention, the device includes a semiconductor substrate, an MOS transistor, and a bipolar transistor having a base region of a first conductivity type. The MOS transistor has source/drain regions of a second conductivity type formed on the main surface of the semiconductor substrate. The bipolar transistor is formed in the main surface of the semiconductor substrate. In the source/drain regions of the MOS transistor, an impurity of the first conductivity type is included which has same concentration as that of the impurity of the first conductivity type included in the base region mentioned above, and an impurity of a second conductivity type included in the source/drain regions has a concentration which is ten times or more than that of the impurity of the first conductivity type included in the source/drain regions.

In the semiconductor device having a bipolar transistor described above, the impurity of the first conductivity type included in the source/drain regions preferably has a concentration of $10^{18}$ cm$^{-3}$ or more.

Further, in the semiconductor device having a bipolar transistor described above, it is preferred that a metal electrode is formed on certain part of the surface of the base region.

According to the method of manufacturing a semiconductor device having a bipolar transistor in accordance with the present invention, in one aspect, a collector region is first formed by introducing an impurity of a second conductivity type into a first region in the main surface of the semiconductor substrate of a first conductivity type. Then, the gate electrode of the MOS transistor is formed on a predetermined region of a second region in the main surface of the semiconductor substrate which does not overlap the first region, with an insulating film inbetween. The impurity of the second conductivity type is selectively introduced to a predetermined region of the collector region, thereby forming the collector wall region. Using the gate electrode as a mask, the impurity of the second conductivity type is introduced to the second region in the main surface of the semiconductor substrate to form the source/drain regions of the MOS transistor. To the entire main surface of the semiconductor substrate, the impurity of the first conductivity type is introduced, thereby forming the base region in the collector region. To a predetermined region in the base region, the impurity of the second conductivity type is introduced selectively, forming the emitter region.

According to the above-described semiconductor device having a bipolar transistor and to the manufacturing method thereof, the impurity for forming the base region can be implanted into the entire main surface of the semiconductor substrate, without forming a resist pattern which exposes the region where the base region is to be formed while covering other regions. Thus, the step of forming a resist pattern for the formation of the base region can be omitted. Accordingly, the process of photolithography for the formation of the resist pattern can also be omitted. As a result, the manufacturing cost can be reduced.

In accordance with another aspect of the method of manufacturing a semiconductor device having a bipolar transistor of the present invention, the collector region is first formed by introducing an impurity of a second conductivity type to a first region in the main surface of the semiconductor substrate of a first conductivity type. The gate electrode of the MOS transistor is formed on the predetermined region of the second region in the main surface of the semiconductor substrate which does not overlap the first region, with an insulating film inbetween. On the main surface of the semiconductor substrate, a resist pattern is formed which exposes the third region in the surface of the collector region where the collector electrode is to be formed and the second region. Using this resist pattern and the gate electrode as masks, the impurity of a second conductivity type is introduced to the second and third regions in the main surface of the semiconductor substrate, thereby forming the collector wall region in the third region, and the source/drain regions of an MOS transistor in the second region. By introducing an impurity of the first conductivity type to the entire main surface of the semiconductor substrate, base region is formed in the collector region. To the predetermined region of the base region, the impurity of the second conductivity type is introduced selectively, forming the emitter region.

According to the method of manufacturing a semiconductor device having a bipolar transistor described above, in addition to the reduction of manufacturing costs as in the above-described one aspect of the method of manufacturing a semiconductor device having a bipolar transistor, the collector wall region and the source/drain regions can be formed in one step. Accordingly, compared to the above-described one aspect, manufacturing process can be further simplified.

In accordance with the above-described another aspect, the method of manufacturing a semiconductor substrate having a bipolar transistor preferably includes the following additional step. An insulating layer is formed entirely on the main surface of semiconductor substrate. In the insulating layer placed on the collector wall region and the source/drain regions, the first, second, and third contact holes are formed. By introducing the impurity of the second conductivity type to the main surface of the semiconductor substrate through these first, second, and third contact holes, first, second, and third impurity regions are formed which have the diffusion depth reaching the collector region placed under the collector wall region.

The method of manufacturing the semiconductor device having a bipolar transistor in this aspect has been devised to solve the problems that are likely to be encountered when the collector wall region and the source/drain regions are formed in one step.

If the source/drain regions of the MOS transistor and the collector wall region are formed in one step, the source/drain regions and the collector wall regions would have a same diffusion depth. For the performance of the MOS transistor, the source/drain regions should preferably be formed not very deep in the substrate. Accordingly, the collector wall region is also formed to have a relatively shallow diffusion depth. This leads to the possibility that the impurity of the first conductivity type for forming the base region would be introduced to the entire main surface of the semiconductor substrate, causing the impurity region of the first conductivity type to be formed in the collector region positioned beneath the collector wall region, which have a relatively shallow diffusion depth. Therefore, the performance of the bipolar transistor is degraded.

In this case, the degradation of the bipolar transistor can be prevented by introducing the impurity of the second conductivity type to the main surface of the semiconductor substrate so as to reach at least the collector region under the impurity region of the first conductivity type described above, forming thereby an impurity region of the second conductivity type. It apparently requires an additional step for forming an impurity region of the second conductivity type. However, this impurity region of the second conductivity type serves to reduce the contact resistance of the electrodes formed in the subsequent steps and the impurity regions such as the source/drain regions of the second conductivity type in the main surface of the semiconductor substrate. Therefore, if provision of such impurity region for reducing contact resistance is taken for granted, the manufacturing cost can be reduced while not degrading performance of the semiconductor device having a bipolar transistor.

In accordance with still another aspect of the present invention, in the method of manufacturing a semiconductor device having a bipolar transistor, the collector region is formed first by introducing an impurity of a second conductivity type to a first region in the main surface of the semiconductor substrate of a first conductivity type. Isolation insulating film is formed selectively on the main surface of the semiconductor substrate such that it covers the element isolation region in the main surface of the semiconductor substrate and a second region where a collector electrode is to be formed on the surface of the collector region. Gate electrode of the MOS transistor is formed on a predetermined region within a third region of the main surface of the semiconductor substrate, which does not overlap the first region. Using this gate electrode as a mask, the impurity of the second conductivity type is introduced to the third region of the main surface of the semiconductor substrate, forming source/drain regions of the MOS transistor. By introducing an impurity of the first conductivity type to the entire main surface of the semiconductor substrate, the base region is formed within the collector region. By selectively introducing the impurity of the second conductivity type to the predetermined region in the base region, the emitter region is formed. On the entire main surface of the semiconductor substrate is formed an insulating layer. Contact holes are formed, one of which penetrates the isolation insulating film and the insulating layer on the second region, and which penetrate the aforementioned insulating layer on the source/drain regions, and surface of portion of the base region, and of the emitter region. Electrodes are formed within the contact holes.

According to the method of manufacturing a semiconductor device having a bipolar transistor in the aspect mentioned above, the manufacturing process can be simplified as in aforementioned one aspect. Also, the isolation insulating film is formed such that it covers the region where the collector electrode is to be formed, and by using this isolation insulating film as a mask, the impurity of the first conductivity type for forming the base region is introduced to the main surface of the semiconductor substrate. Therefore, there is no possibility that the impurity of the first conductivity type is introduced to the region where the collector electrode is to be formed. Thus, the formation of the collector wall region can be omitted. The resistance of the current flowing through the collector region would be higher than the resistance in the semiconductor device having a bipolar transistor formed by the manufacturing method of the foregoing one aspect and another aspect. Thus, the performance of the semiconductor device is degraded to some extent compared to the semiconductor device formed through the above described one and another aspects. However, since the step for forming the collector region can be omitted, the manufacturing process can be further simplified.

In accordance with still another aspect of the method of manufacturing a semiconductor device having a bipolar transistor of the present invention, an impurity of a second conductivity type is introduced to a first region in the main surface of the semiconductor device of a first conductivity type to form the collector region. An isolation insulating film is formed selectively on the main surface of the semiconductor substrate such that it covers an element isolation region in the main surface of the semiconductor substrate and a second region where the collector electrode is to be formed in the surface of the collector region. Gate electrode of the MOS transistor is formed on a predetermined region of a third region which does not overlap the first region in the main surface of the semiconductor substrate. Using the gate electrode as a mask, the impurity of the second conductivity type is introduced to the third region of the main surface of the semiconductor substrate thereby forming source/drain regions of the MOS transistor. By introducing an impurity of the first conductivity type to the entire main surface of the semiconductor substrate, the base region is formed within the collector region. By selective introduction of the impurity of the second conductivity type to the predetermined region in the base region, the emitter region is formed. A first insulating layer is formed entirely on the main surface of the semiconductor substrate. First contact holes are formed, one of which penetrates the first insulating layer and the isolation insulating film on the second region, and penetrates the first insulating layer placed on at least one of the source/drain regions. Pad layers are formed on the inner surface of the first contact holes to the upper surface of the first insulating layer. A second insulating layer is formed to cover the first insulating layer and the pad layers. Second contact holes are formed which penetrates the first and the second insulating layers placed on the predetermined region at the surface of the emitter region and on the predetermined region at the surface of the base region, and which penetrates the second insulating layer placed on the pad layers. Within the second contact hole is formed a metal electrode.

The method of manufacturing a semiconductor device having a bipolar transistor described above has been, as in the aforementioned still another aspect, devised to prevent the problems that are likely to be encountered when deep contact holes penetrating the isolation insulating film at the region where the collector electrode is to be formed and penetrating the insulating layer formed over this isolation insulating film are formed.

As mentioned above, when the contact hole is formed such that it penetrates the insulating layer over the isolation insulating film as well as the isolation insulating film at the region where the collector electrode is to be formed, the contact hole formed in that area is made deeper than other contact holes. Thus, the aspect ratio of the contact hole which penetrates the isolation insulating film is increased. Within this contact hole with high aspect ratio is formed a metal electrode consisting of Al or the like. Forming a metal electrode within a contact hole with a high aspect ratio in this manner leads to a higher possibility of the metal electrode being disconnected in the contact hole. Accordingly, the semiconductor device having a bipolar transistor may possibly be less reliable.

In such a case, a first insulating film of a predetermined thickness is first formed entirely over the main surface of the semiconductor substrate, and one of first contact holes is formed to penetrate this first insulating layer and the isolation insulating film in the region where the collector electrode is to be formed and others are formed to penetrate the first insulating layer on other impurity regions of the second conductivity type. By adjusting the first insulating layer to an appropriate thickness, the aspect ratio of the first contact holes can be made relatively small. In these first contact holes are formed the pad layers. A second insulating layer of a predetermined thickness is formed to cover these pad layers and the first insulating layer. The second contact holes are formed such that they penetrate at least this second insulating layer. Again by adjusting the second insulating layer to an appropriate thickness, the aspect ratio of the second contact holes can be made relatively small.

Thus, forming a first and a second insulating layers and adjusting thicknesses thereof appropriately allows an adjustment of the aspect ratio of the first and the second contact holes. By this adjustment, the disconnection of the metal electrodes in the contact holes can be prevented.

Also in this case, the manufacturing steps are increased, apparently, since steps for forming the second insulating layer, the second contact holes, pad layer etc. are required. However, in order to prevent the problems due to the increased aspect ratio of the contact holes as mentioned above, addition of a similar step would be required as a matter of course, even in the conventional example. From this point of view, simplification of the manufacturing process is enabled compared to the conventional example.

In still another aspect of the method of manufacturing a semiconductor device having a bipolar transistor according to the present invention, it is assumed that the semiconductor device having a bipolar transistor manufactured in this method includes a semiconductor substrate of a first conductivity type having a main surface, an impurity region of a second conductivity type formed on a first region of this main surface of the semiconductor substrate, and a bipolar transistor formed on a second region which does not overlap the first region of the main surface of the semiconductor substrate having a base region of the first conductivity type and a collector region of the second conductivity type. By introducing an impurity of the first conductivity type to the impurity region and to the collector region simultaneously, the base region is formed in the collector region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments in accordance with the present invention will be described hereinafter, with reference to FIGS. 1 to 28.

First Embodiment

Figure 1:
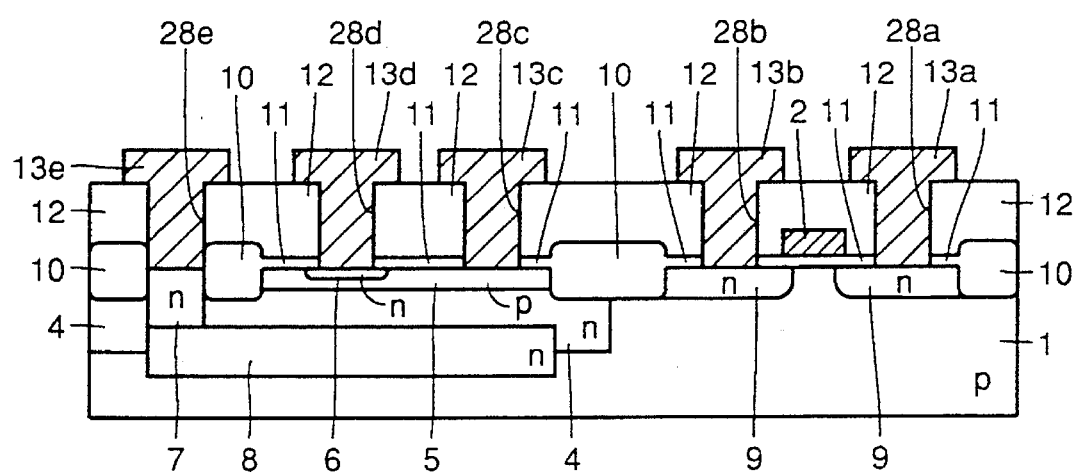
FIG. 1 is a cross sectional view showing a BiNMOS of the first embodiment in accordance with the present invention.

Referring to FIGS. 1 to 5, a first embodiment in accordance with the present invention will be described. FIG. 1 is a cross sectional view showing a semiconductor device having a bipolar transistor (BiNMOS) of the first embodiment according to the present invention. The cross section of FIG. 1 corresponds to the cross section of the conventional example shown in FIG. 30.

Figure 30:
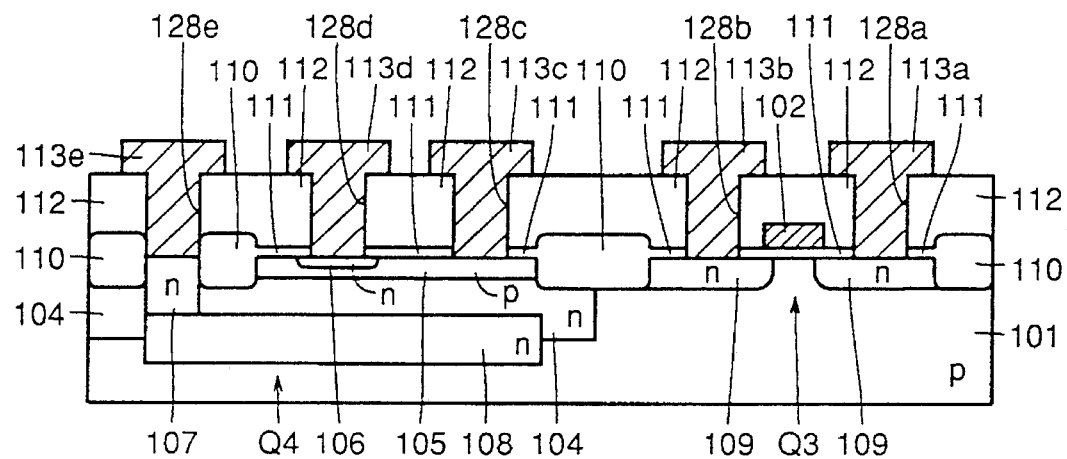
FIG. 30 is a cross sectional view corresponding to a portion 100 of FIG. 29.
Figure 31:
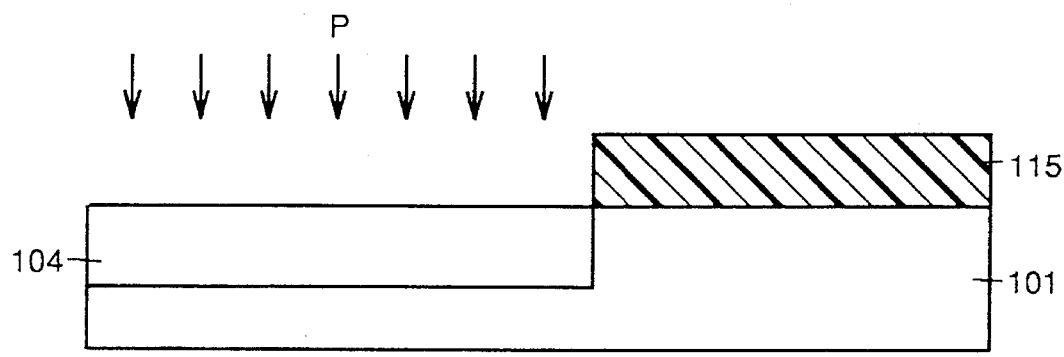
FIGS. 31 to 38 are cross sectional views illustrating the first to eighth steps in the manufacturing process of BiNMOS shown in FIG. 30.
Figure 32:
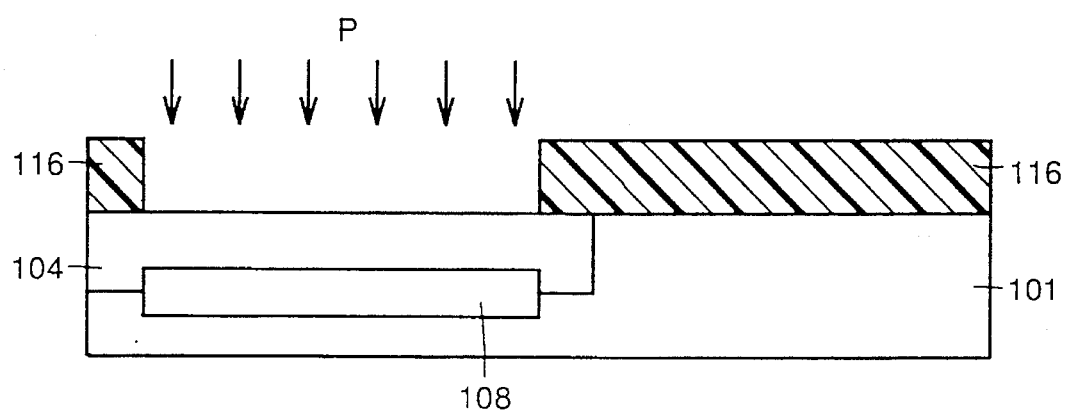
Figure 33:
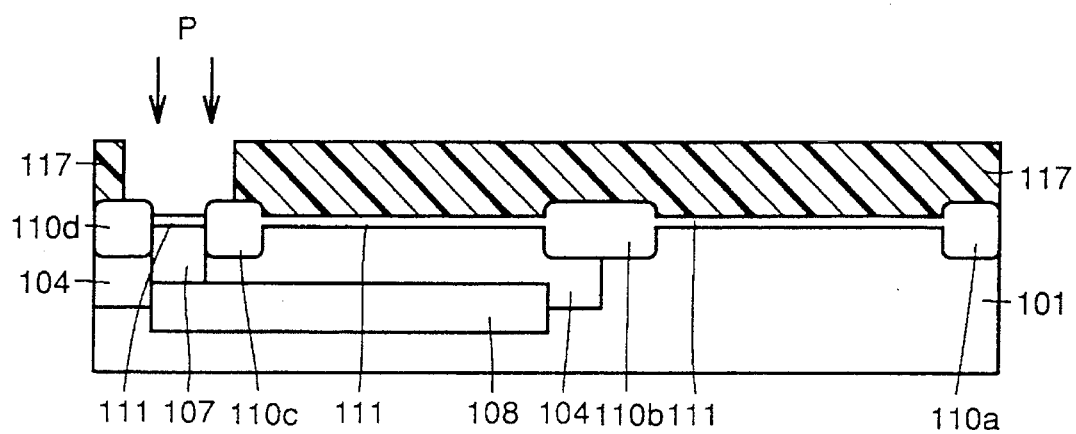
Figure 34:
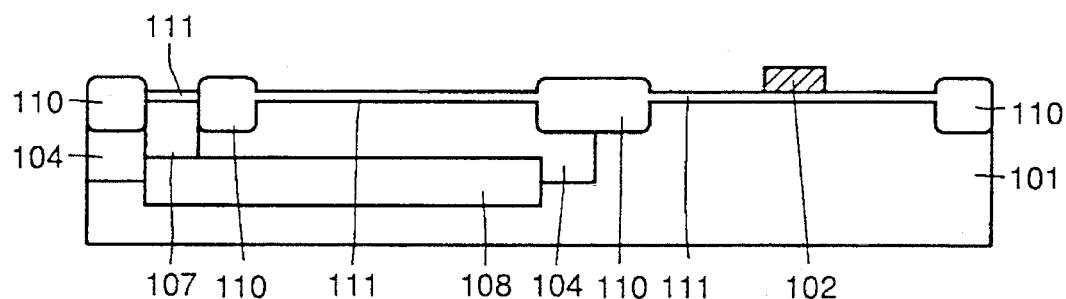
Figure 35:
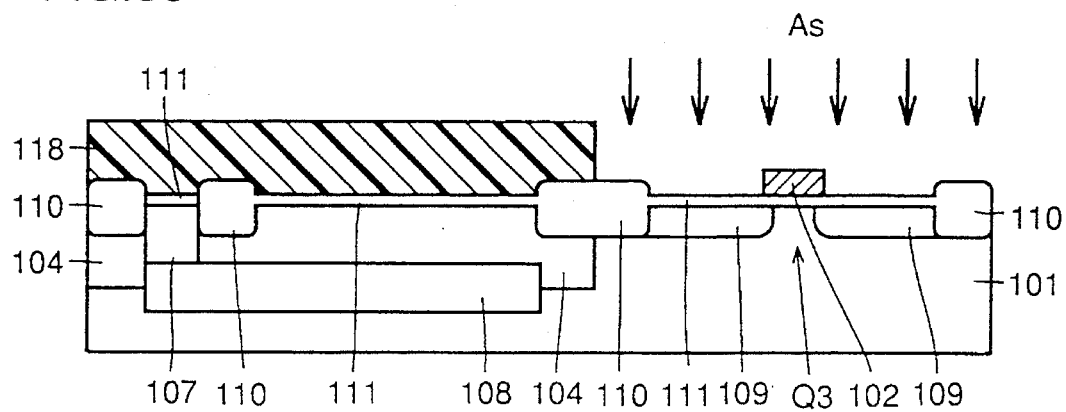
Figure 36:
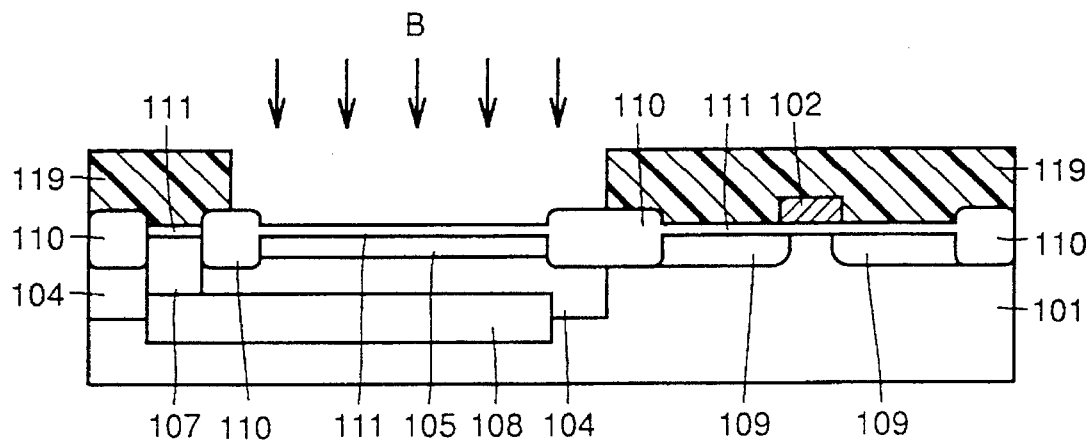
Figure 37:
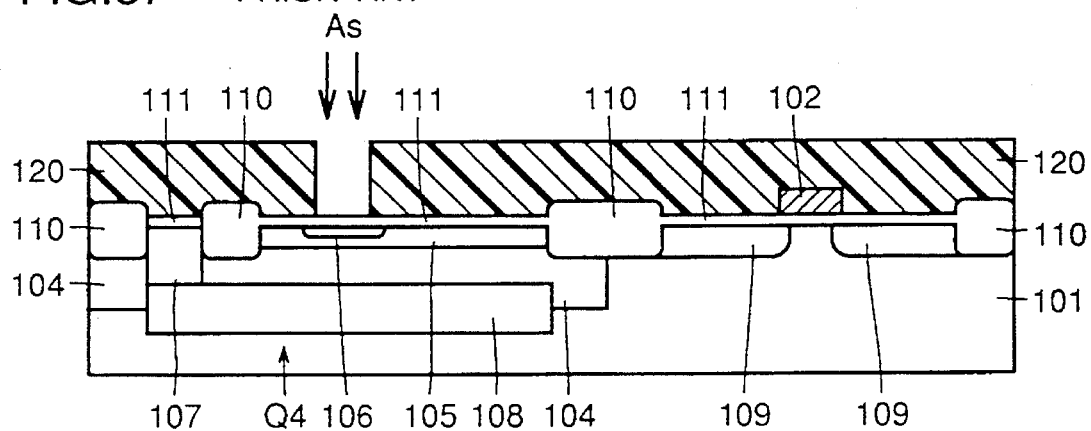
Figure 38:
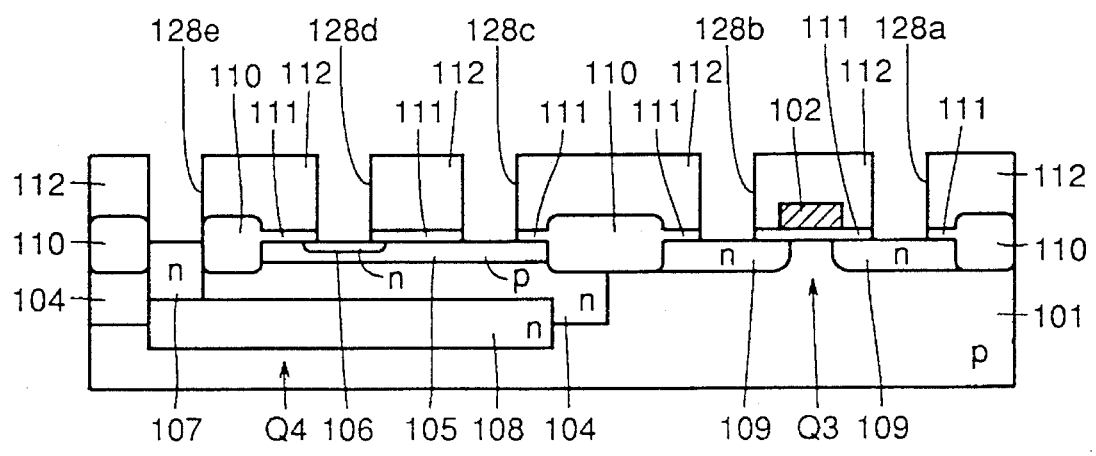

Referring to FIG. 1, the cross sectional structure of the BiNMOS shown here is similar to the structure shown in FIG. 30. That is, on the main surface of a p type semiconductor substrate 1, formed are an npn bipolar transistor and an n channel MOS transistor. Npn bipolar transistor includes an n type collector region 4, a p type base region 5, an n type emitter region 6, an n type floating collector region 8, and an n type collector wall region 7.

N channel MOS transistor has n type impurity regions 9, 9 which are to be source/drain regions, and a gate electrode 2. In an element isolation region in the main surface of p type semiconductor substrate 1, an isolation insulating film 10 is formed selectively. On the main surface of p type semiconductor substrate 1 is formed an interlayer insulating film (interlayer insulating layer) 12. In the predetermined regions of this interlayer insulating film 12, contact holes 28a, 28b, 28c, 28d, and 28e are formed, respectively. In these contact holes 28a to 28e, metal electrodes 13a, 13b, 13c, 13d, and 13e are formed, respectively. Material of these metal electrodes 13a to 13e may be aluminum (Al) or the like.

As described above, the structure of BiNMOS shown in FIG. 1 is similar to that of the conventional BiNMOS shown in FIG. 30 in appearance. However, it differs in that in BiNMOS of FIG. 1, concentration of an p type impurity included in n type impurity regions 9, 9 and collector wall region 7 is equal to that of the p type impurity included in base region 5.

This is because base region 5 is formed in the present embodiment by introducing the p type impurity to the entire main surface of p type semiconductor substrate 1 without forming any mask layers such as resist patterns on the main surface of p type semiconductor substrate 1. Thus, into n type impurity regions 9, 9 and collector wall region 7, the same amount of the p type impurity as that of the p type impurity for forming base region 5 is introduced. Even when the p type impurity for forming base region 5 is introduced to n type impurity regions 9, 9 or collector wall region 7 as above, degradation of the performance of the BiNMOS can be prevented by setting higher the concentration of an n type impurity included in n type impurity regions 9, 9 or collector wall region 7 than the concentration of the p type impurity included in base region 5. More particularly, concentration of the n type impurity in n type impurity regions 9, 9 and collector wall region 7 is preferably ten times or more than the concentration of the p type impurity included in base region 5. In this way, degradation in the performance of BiNMOS can be prevented.

Particular concentrations of base region 5, n type impurity regions 9, 9, collector wall region 7, etc. are as follows. To adjust collector-emitter breakdown voltage to at least 5V, concentration of the p type impurity in base region 5 needs to be $10^{18}$ cm$^{-3}$ or more. Accordingly, concentration of the n type impurity in n type impurity regions 9, 9 and collector wall region 7 may preferably be $10^{19}$ cm$^{-3}$ or more. P type semiconductor substrate 1 has concentration of up to $10^{15}$ cm$^{13}$, and concentration of the n type impurity in collector region 4 is up to $10^{16}$ cm$^{-3}$ at this time. Concentration of the n type impurity in floating collector region 8 is $10^{19}$ cm$^{-3}$ or more.

Figure 2:
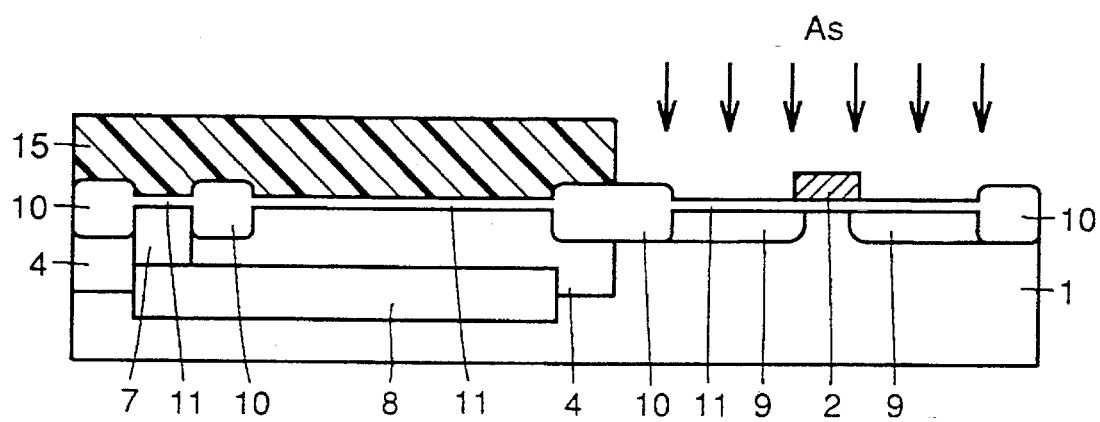
FIGS. 2 and 3 are cross-sectional views illustrating the fifth and sixth steps in the manufacturing process of BiNMOS of the first embodiment in accordance with the present invention.
Figure 3:
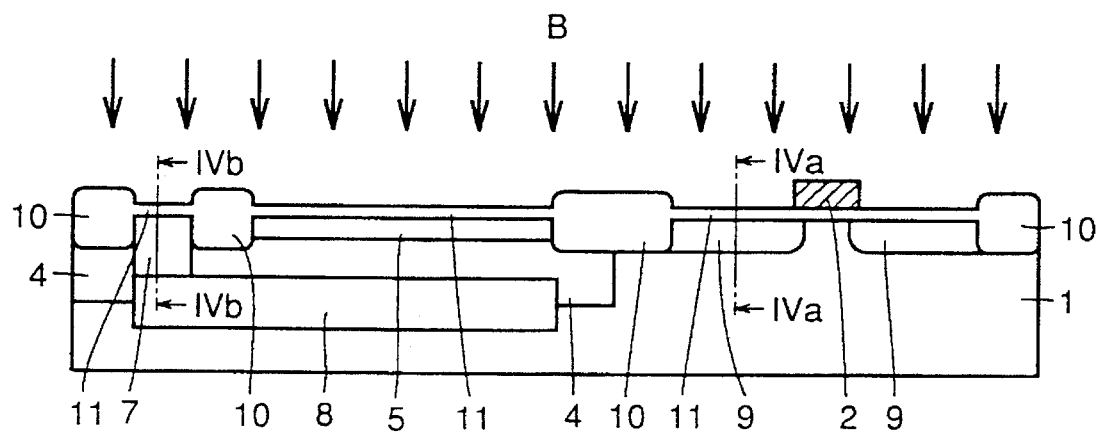

Referring now to FIGS. 2 to 5, method of manufacturing the BiNMOS shown in FIG. 1 will be described. FIGS. 2 and 3 are cross sectional views illustrating the fifth and sixth steps in the manufacturing process of BiNMOS shown in FIG. 1. FIG. 4A shows the distribution of impurity concentration after the formation of base region 5 in the region along line IVa—IVa of FIG. 3. FIG. 4B shows the distribution of impurity concentration after the formation of base region 5 in the region along line IVb—IVb of FIG. 3.

Referring to FIG. 2, collector region 4, floating collector region 8, collector wall region 7, isolation insulating film 10, gate insulating film 11, gate electrode 2, and n type impurity regions 9, 9 are formed respectively at the main surface of p type semiconductor substrate 1. Upon formation of n type impurity regions 9, 9, as shown in FIG. 2, As (arsenic) is implanted into the main surface of semiconductor substrate 1 using a resist pattern 15 as a mask. The condition of this implantation should be 20 to 50 keV, and $10^{15}$ to $10^{16}$ cm$^{-2}$. Resist pattern 15 is then removed.

Referring now to FIG. 3, the p type impurity such as boron (B) is implanted into the entire main surface of p type semiconductor substrate 1, without forming a resist pattern to be used as a mask layer on the main surface of p type semiconductor substrate 1. The condition of this implantation should be 10 to 20 keV, and $10^{13}$ to $10^{14}$ cm$^{-2}$. In this way, p type base region 5 is formed at the surface portion of collector region 4.

Figure 4A:
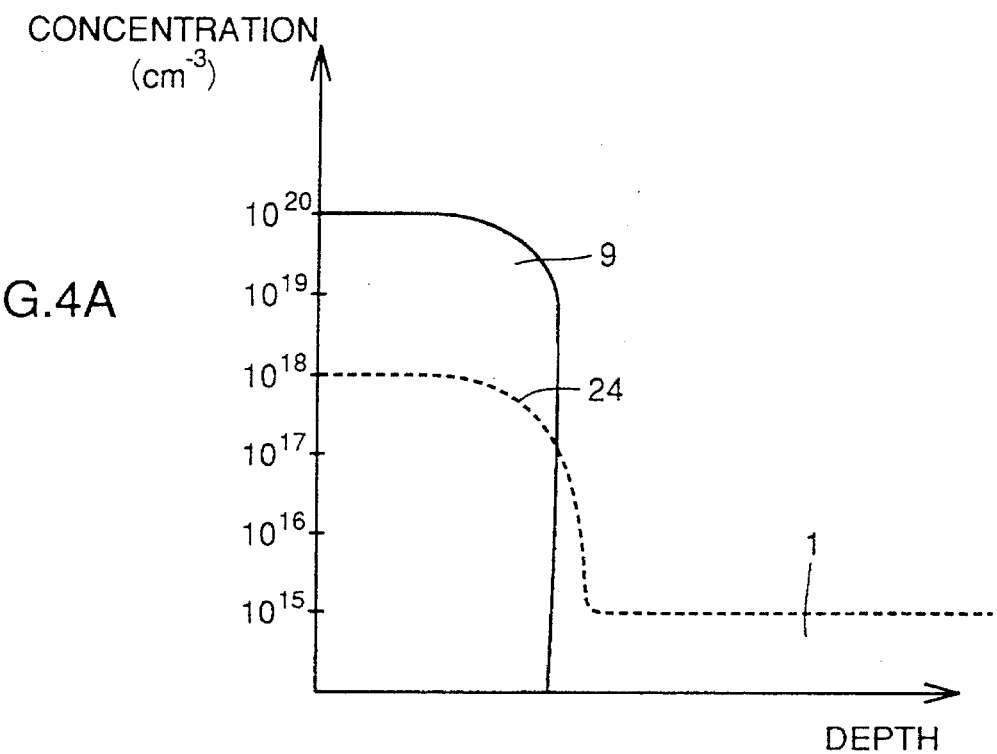
FIG. 4A is a graph showing the distribution of impurity concentration in and under an n type impurity region after a base region is formed.
Figure 4B:
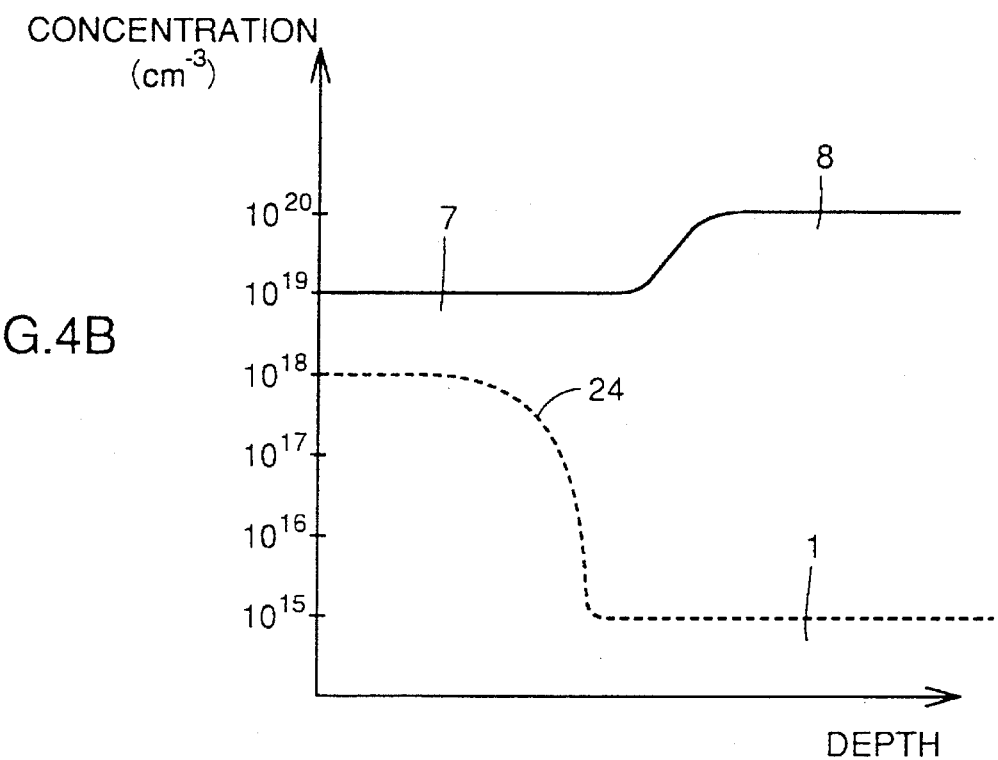
FIG. 4B is a graph showing the distribution of impurity concentration in and under a collector wall region after the base region is formed.

Referring to FIGS. 4A and 4B, by implanting the p type impurity for forming above-described base region 5 to the entire main surface of semiconductor substrate 1, the p type impurity, concentration of which being equal to that of the p type impurity included in base region 5, is introduced also to n type impurity region 9 and collector wall region 7. However, it does not cause any problem in the characteristics of the device, since as shown in FIGS. 4A and 4B, concentration of the n type impurity included in n type impurity region 9 and collector wall region 7 is at least ten times higher than that of the p type impurity included in n type impurity region 9 and collector wall region 7.

As described above, base region 5 is formed by implanting the p type impurity such as boron (B) into the entire main surface of semiconductor substrate 1, so that the step of forming a resist pattern for forming base region 5 as in the conventional example can be omitted. Accordingly, the process of photolithography required for the formation of the resist pattern can be omitted, enabling reduction of the manufacturing cost.

Thereafter, through a process similar to the conventional example, BiNMOS of FIG. 1 is obtained.

Second Embodiment

Figure 5:
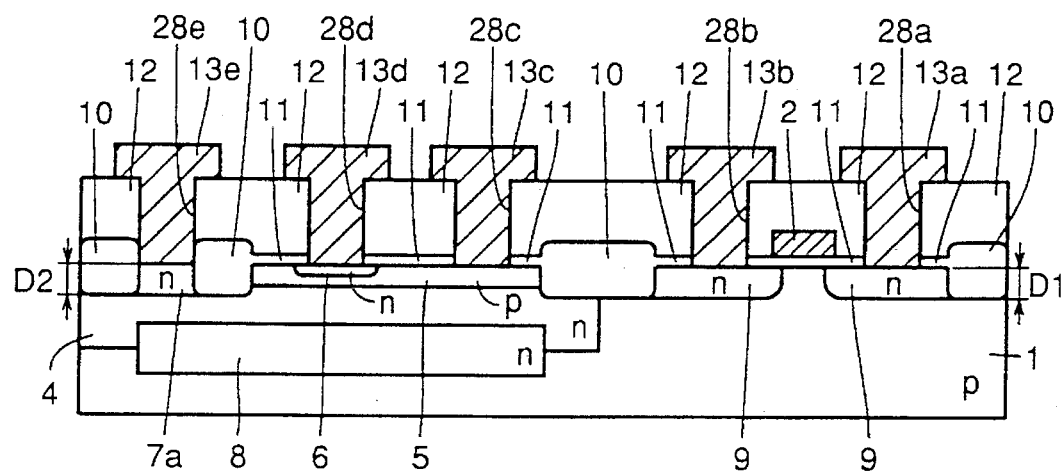
FIG. 5 is a cross sectional view showing a BiNMOS of the second embodiment in accordance with the present invention.

Referring to FIGS. 5 to 9, a second embodiment in accordance with the present invention will now be described. FIG. 5 is a cross sectional view showing a BiNMOS of the second embodiment in accordance with the present invention. Referring to FIG. 5, the difference between the BiNMOS here and the BiNMOS of the first embodiment shown in FIG. 1 is that in BiNMOS of the present embodiment, the diffusion depth D1 of n type impurity regions 9, 9 is equal to the diffusion depth D2 of a collector wall region 7a. By setting equal the diffusion depth of n type impurity regions 9, 9 and of collector wall region 7a, n type impurity regions 9, 9 and collector wall region 7a can be formed in one step. Accordingly, manufacturing process can be further simplified compared to the above-described first embodiment.

Figure 6:
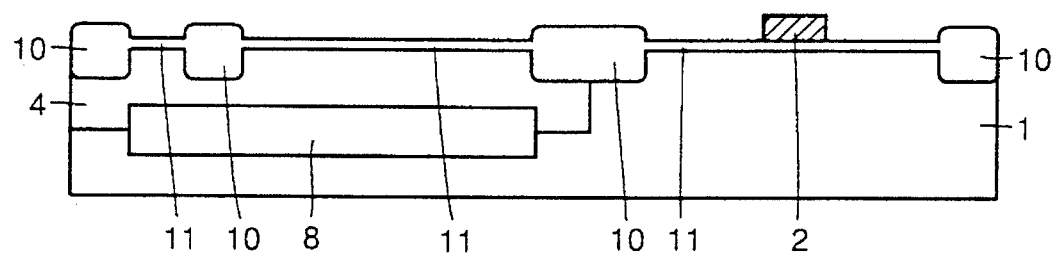
FIGS. 6 to 8 are cross sectional views illustrating the fourth to sixth steps in the manufacturing process of the BiNMOS of the second embodiment in accordance with the present invention.
Figure 7:
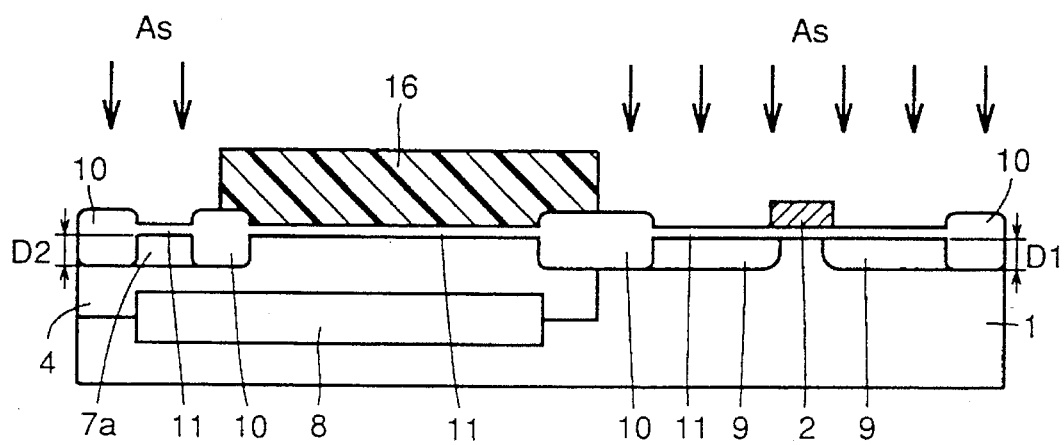
Figure 8:
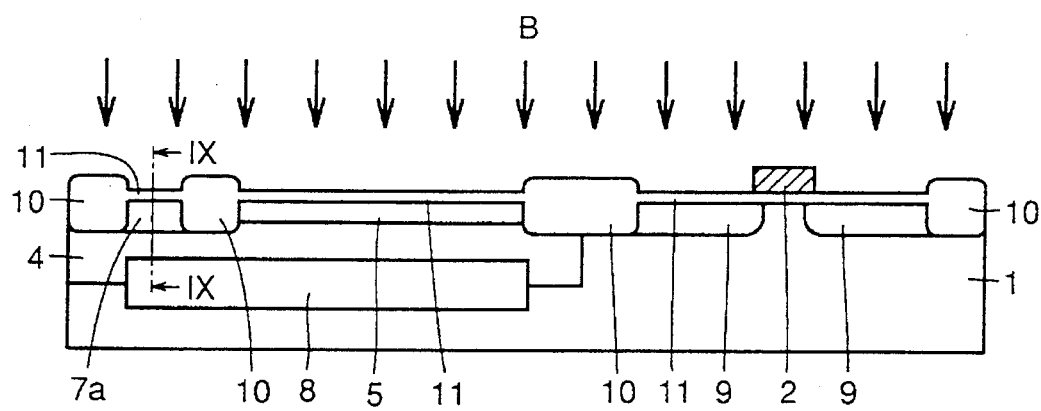

Referring now to FIGS. 6 to 8, a method for manufacturing the BiNMOS of the present embodiment shown in FIG. 5 will be described. FIGS. 6 to 8 are cross sectional views showing the fourth to sixth steps in the process for manufacturing the BiNMOS of the second embodiment in accordance with the present invention.

Referring to FIG. 6, a process similar to that of the above-described first embodiment is carried on until a gate electrode 2 is formed. At this time, however, unlike the above-described first embodiment, collector wall region 7 is not formed at this stage.

Referring next to FIG. 7, a resist pattern 16 is formed on the main surface of a p type semiconductor substrate 1, exposing regions where collector wall region 7a and n type impurity regions 9, 9 are to be formed, while covering other regions. Using this resist pattern 16 as a mask, an n type impurity such as arsenic (As) is implanted into the main surface of p type semiconductor substrate 1. The condition of this implantation should be about 20 to about 50 keV and about $10^{15}$ to about $10^{16}$ cm$^{-2}$. Thus, collector wall region 7a and n type impurity regions 9, 9 are formed in one step. Accordingly, manufacturing process can be simplified even further than the process in the first embodiment above, which also contributes to the reduction of manufacturing costs.

The above-mentioned D1 should not preferably be very large, considering the characteristics of the MOS transistor. Specifically, D1 should preferably be about 0.1 μm to about 0.2 μm. Thus, diffusion depth D2 of collector wall region 7a should also be about 0.1 μm to about 0.2 μm.

Referring next to FIG. 8, a p type impurity such as boron (B) is implanted into the entire main surface of p type semiconductor substrate 1, as in the first embodiment described above. The condition is similar to the above-described first embodiment. Thus, a p type base region 5 is formed at the surface portion of a collector region 4. By introducing the p type impurity for forming base region 5 to the main surface of p type semiconductor substrate 1 in this way, without forming a mask layer such as a resist pattern on the main surface of p type semiconductor substrate 1, reduction of manufacturing cost is enabled as in the first embodiment described above.

Figure 9:
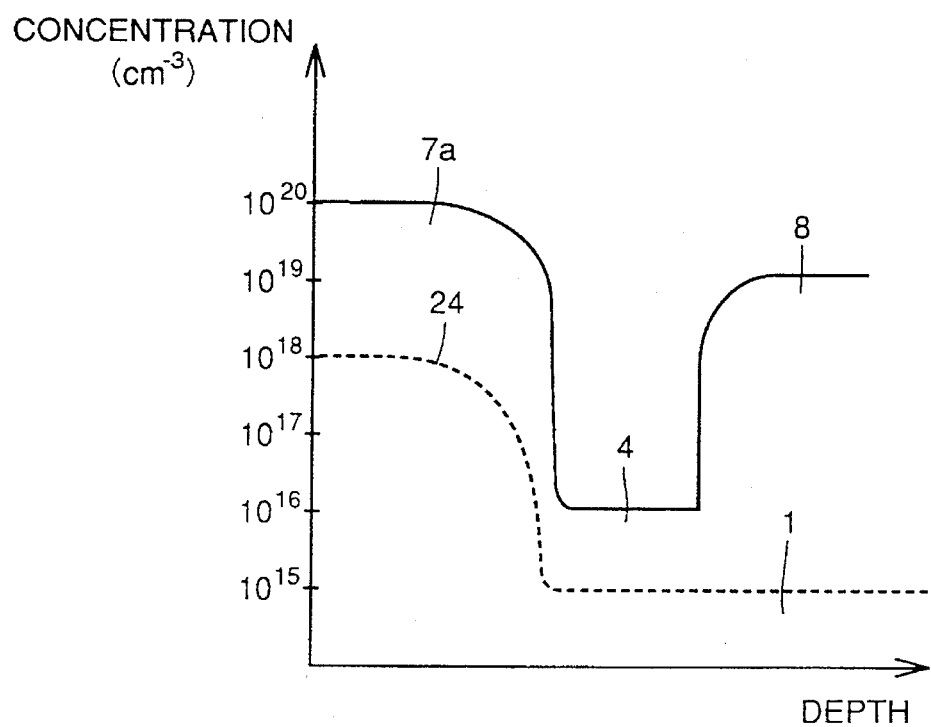
FIG. 9 shows the distribution of impurity concentration in and under the collector wall region after the base region is formed, in the second embodiment according to the present invention.

FIG. 9 shows the distribution of impurity concentration in the portion along line IX—IX in FIG. 8, after the p type impurity for forming base region 5 is introduced. Referring to FIG. 9, collector wall region 7a is formed in the same step as n type impurity regions 9, 9 in the present embodiment, so that it is formed at a shallower position than collector wall region 7 of FIG. 4B.

At this time, p type impurity 24 for forming base region 5 should be implanted, as shown in FIG. 9, preferably with selected conditions such that a portion with high concentration (that is, more than $10^{15}$ cm$^{-3}$) of p type impurity 24 for forming base region 5 can be covered by collector wall region 7a. In this way, formation of p type impurity region in collector region 4 under collector wall region 7a can be prevented effectively, and degradation of the BiNMOS can be prevented.

Thereafter, through a process similar to the conventional example, BiNMOS of FIG. 5 is formed as in the first embodiment described previously.

Third Embodiment

A third embodiment in accordance with the present invention will now be described, with reference to FIGS. 10 to 16. The present embodiment has been devised to solve a problem which is likely to be encountered in the above-described second embodiment.

Figure 10:
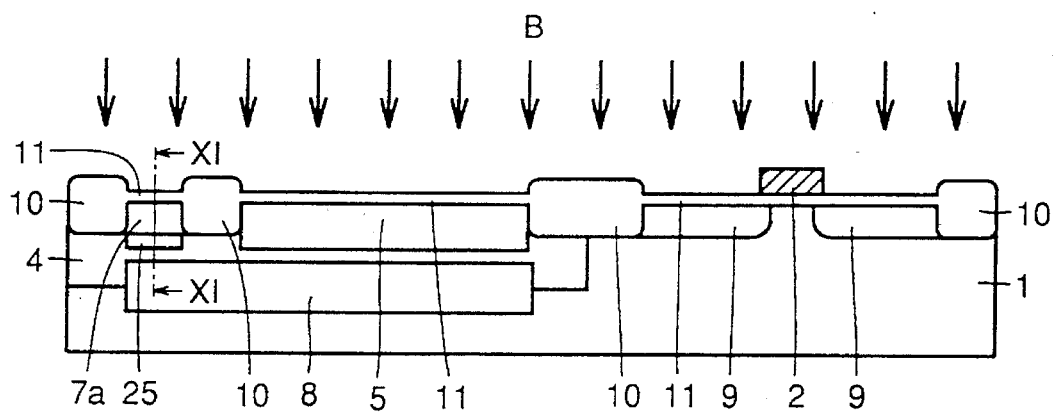
FIG. 10 is a cross sectional view illustrating a problem which is likely to be encountered in the second embodiment.
Figure 11:
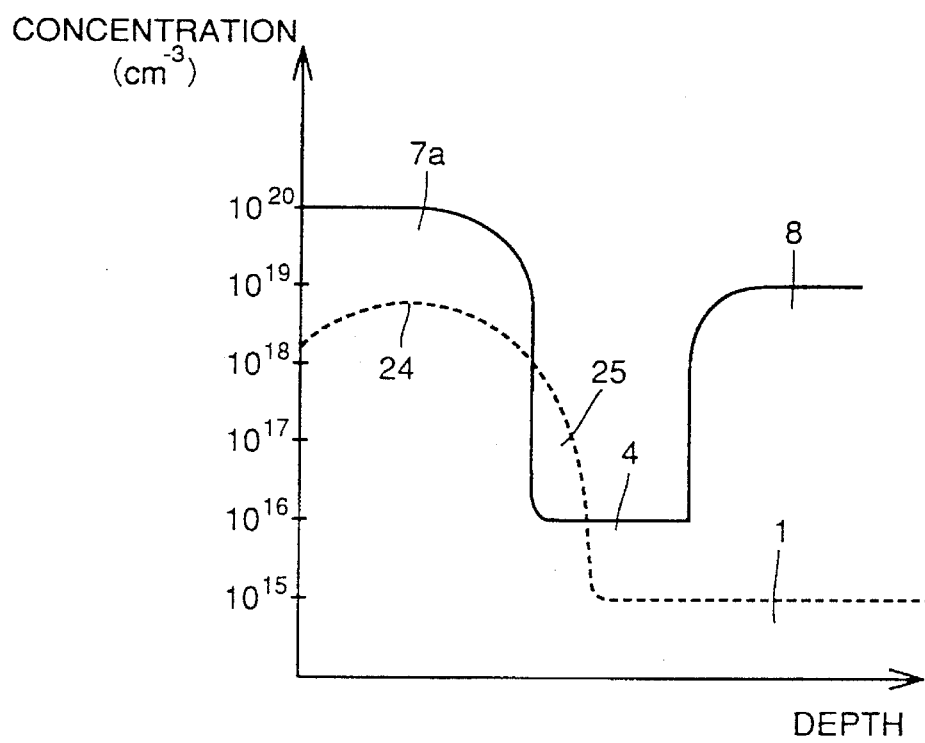
FIG. 11 shows the distribution of impurity concentration in and under the collector wall region in FIG. 10.

The problem which is likely to be encountered in the above-described second embodiment will be described first. FIG. 10 is a cross sectional view of a BiNMOS suffering from this problem. FIG. 11 shows a distribution of impurity concentration in the regions along line XI—XI of FIG. 10.

Referring first to FIG. 10, when a p type impurity for forming a base region is implanted with relatively high energy or when amount (dose) of the impurity is large in the above-described second embodiment, the p type impurity such as boron (B) for forming base region 5 is implanted into the main surface of p type semiconductor substrate 1, thereby possibly forming a p type impurity region 25 in collector region 4 located under collector wall region 7a which is formed at a relatively shallow position, as shown in FIG. 10.

As shown in FIG. 11, this problem arises when collector wall region 7a could not cover the high concentration portion of the p type impurity 24 for forming base region 5. As shown in FIGS. 10 and 11, formation of p type impurity region 25 in collector region 4 degrades the characteristics of the device by, for instance, causing increase of collector resistance.

Figure 12:
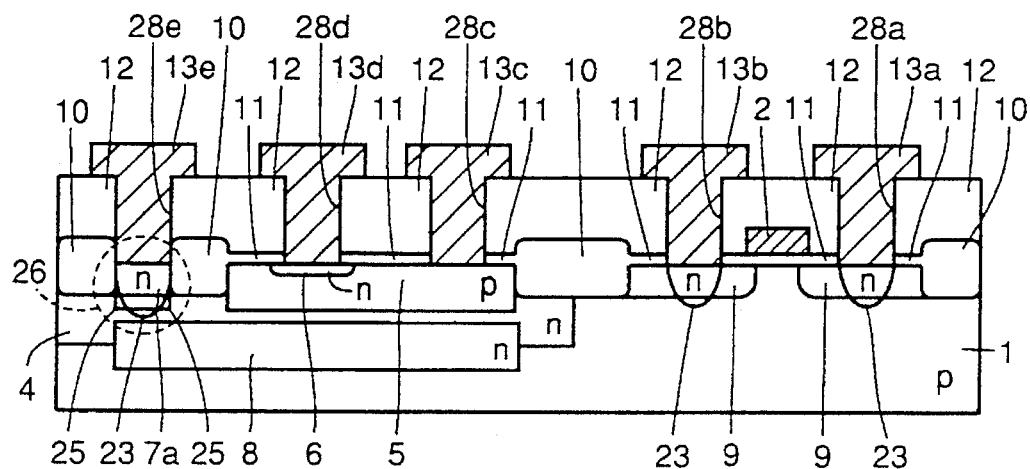
FIG. 12 is a cross sectional view showing a BiNMOS of the third embodiment in accordance with the present invention.

The present embodiment was devised to solve such problem which degrades the characteristics of the device. FIG. 12 is a cross sectional view showing a BiNMOS of the third embodiment in accordance with the present invention.

Referring to FIG. 12, in the present embodiment, an n type impurity region 23 (hereinafter called "SAC (Self Align Contact) layer") is formed which provides an electrical connection between a collector wall region 7a and a collector region 4. Concentration of this SAC layer should be about $10^{18}$ to about $10^{20}$ cm$^{-3}$. Formation of this SAC layer allows collector wall region 7a and collector region 4 to be connected electrically by n type impurity region (SAC layer 23), even if p type impurity region 25 is formed under collector wall region 7a.

As a result, the increase of collector resistance can be prevented. Also, this SAC layer 23 serves to reduce the contact resistance between a metal electrode (collector electrode) 13e and collector wall region 7a. Accordingly, as shown in FIG. 12, it is preferred that this SAC layer 23 is also formed at junction interfaces between n type impurity regions 9, 9 and metal electrodes 13a, 13b. By forming SAC layers 23 in this manner, contact resistance between the metal electrodes and the impurity regions connected to these metal electrodes can be reduced, thereby improving the performance of the device. Accordingly, these SAC layers 23 may also be formed in the conventional example described previously.

Figure 13:
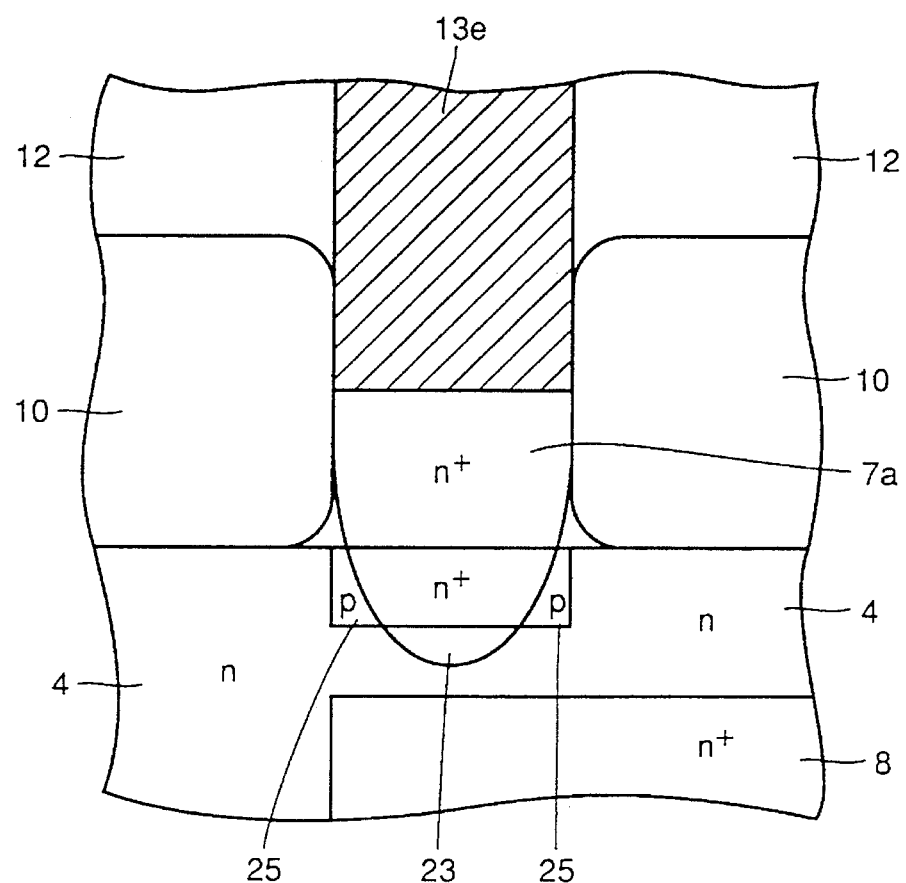
FIG. 13 shows an enlarged cross section in the vicinity of the collector wall region of FIG. 12.

Referring now to FIG. 13, structure in the vicinity of collector wall region 7a will be described in more detail. FIG. 13 shows an enlarged cross section in the vicinity of collector wall region 7a.

Referring to FIG. 13, p type impurity region 25 is formed under collector wall region 7a. SAC layer 23 is formed such that it partially overlaps collector wall region 7a and p type impurity region 25, as well as collector region 4. That is, SAC layer 23 is formed to penetrate p type impurity region 25 to reach collector region 4. Thus, the increase of collector resistance caused by this p type impurity region 25 being formed in collector region 4 can be prevented. Further, SAC layer 23 may also be formed to reach a floating collector region 8.

Figure 14:
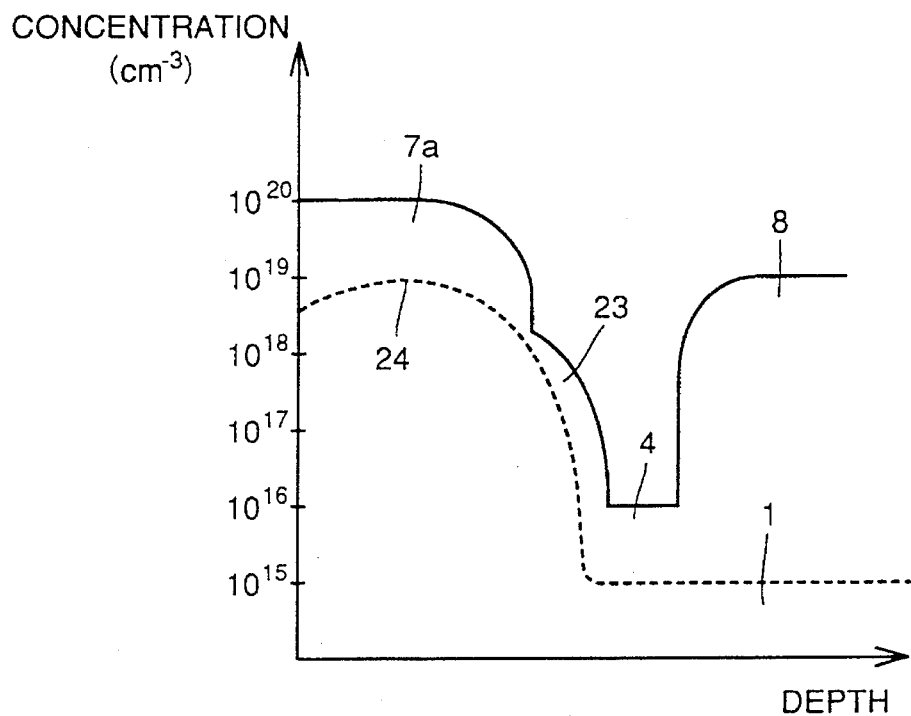
FIG. 14 shows the distribution of impurity concentration in and under the collector wall region in FIG. 12.

Referring now to FIG. 14, distribution of impurity concentration in collector wall region 7a and its vicinity when SAC layer 23 is formed will be described. FIG. 14 shows the distribution of impurity concentration in collector wall region 7a and its vicinity when SAC layer 23 is formed.

Referring to FIG. 14, a portion of p type impurity 24 with high concentration is covered by at least one of collector wall region 7a and SAC layer 23. Thus, n type SAC layer 23 can form an electrically connecting portion between collector wall region 7a and collector region 4. As a result, increase of collector resistance can be prevented, thereby preventing the degradation in performance of the device.

Figure 15:
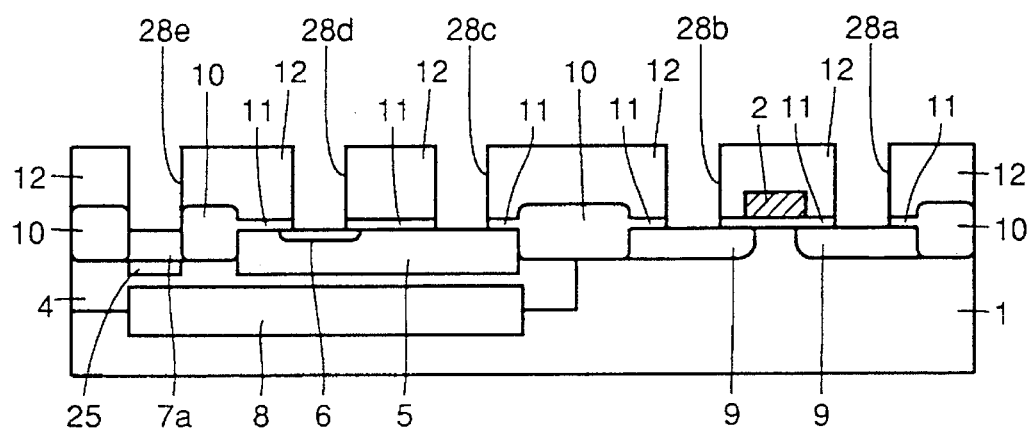
FIGS. 15 and 16 are cross sectional views illustrating the eighth and ninth steps in the manufacturing process of the BiNMOS of the third embodiment in accordance with the present invention.
Figure 16:
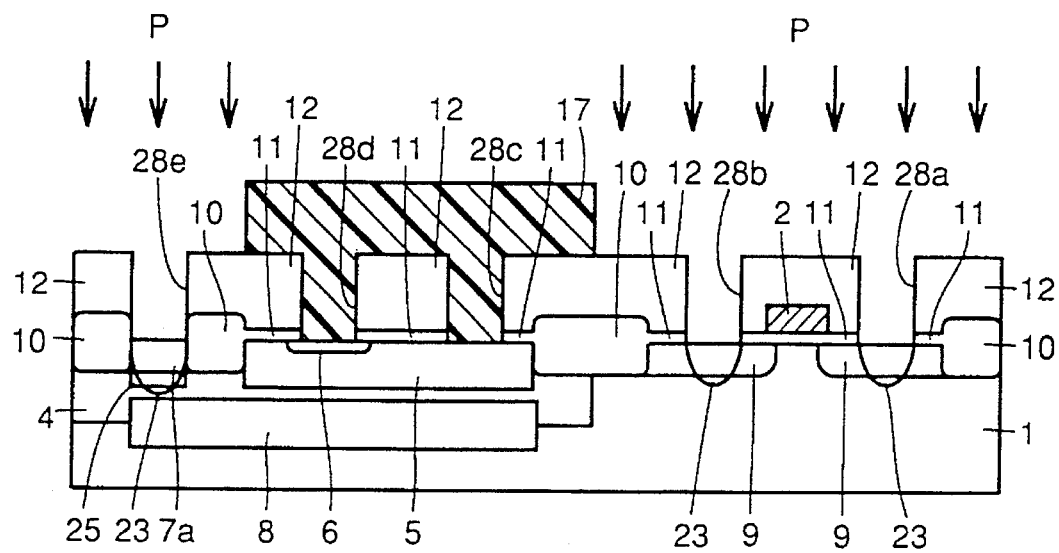

Referring now to FIGS. 15 and 16, manufacturing method of BiNMOS shown in FIG. 12 will be described. FIGS. 15 and 16 are cross sectional views illustrating the eighth and ninth steps in the manufacturing process of BiNMOS of the third embodiment in accordance with the present invention.

Referring to FIG. 15, a process similar to that of the above-described second embodiment is carried on until contact holes 28a to 28e are formed. Shown in FIG. 15 is a situation in which p type impurity region 25 has been formed under collector wall region 7a.

Referring now to FIG. 16, a resist pattern 17 is formed on an interlayer insulating film 12, exposing contact holes 28b, 28a, and 28e. Using this resist pattern as a mask, an n type impurity such as phosphorus (P) is implanted into the main surface of a p type semiconductor substrate 1. The condition of this implantation is 30 to 60 keV and $10^{14}$ to $10^{16}$ cm$^{-2}$. Also, the amount of the impurity and the energy of implantation may be larger than described above. Thus, SAC layers 23 are formed.

Thereafter, through a process similar to the first and second embodiments described previously, BiNMOS of the third embodiment shown in FIG. 12 is formed.

In the above-described method of manufacturing a BiNMOS of the present embodiment, the step of forming SAC layers 23 and the step of forming resist pattern 17 for forming SAC layers 23 are required. Accordingly, a process of photolithography to form resist pattern 17 is also required. Therefore, manufacturing cost is increased to some extent compared to the first and second embodiments described previously. However, by forming SAC layers 23, contact resistance between n type impurity regions 9, 9 and metal electrodes 13a, 13b and contact resistance between collector wall region 7a and metal electrode 13e can be made lower than the aforementioned first and second embodiments. Accordingly, characteristics of the device is improved. Generation of leak current between p type semiconductor substrate 1 and n type impurity region 9, caused by not forming resist pattern in the right position in formation of contact holes, is restrained. Therefore margin in manufacturing process can be improved.

In order to improve the characteristics of the device and margin in manufacturing process as described above, it may also be appropriate to form these SAC layers 23 in the conventional example, and in the first and second embodiments described previously. If formation of these SAC layers 23 is taken for granted, the manufacturing cost can be reduced in the present embodiment as well as in the above-described first and second embodiments, compared to the conventional example.

Fourth Embodiment

Figure 17:
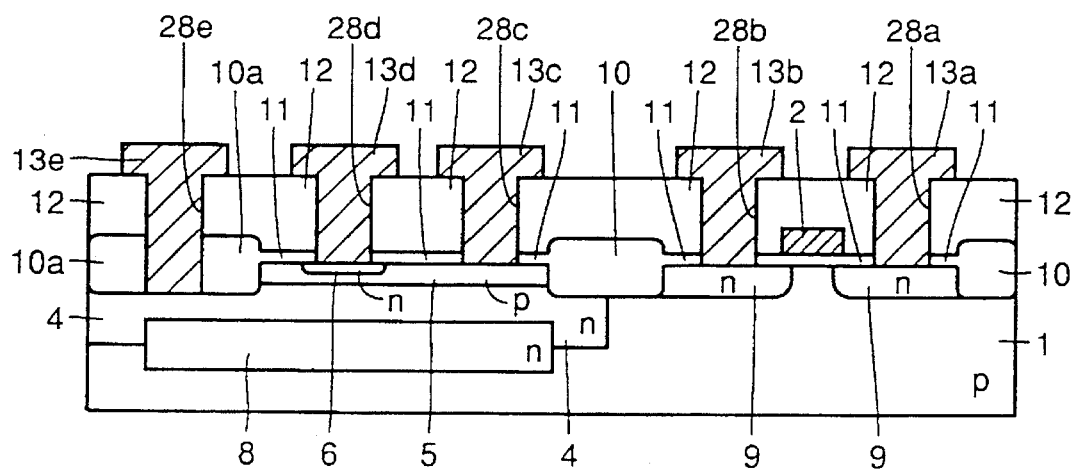
FIG. 17 is a cross sectional view showing a BiNMOS of the fourth embodiment in accordance with the present invention.

Referring to FIGS. 17–20, a fourth embodiment in accordance with the present invention will now be described. FIG. 17 is a cross sectional view showing a BiNMOS of the fourth embodiment in accordance with the present invention.

Referring to FIG. 17, the differences between BiNMOS of the present embodiment and BiNMOS of the first embodiment described previously is that a contact hole 28e is provided so as to penetrate an interlayer insulating film 12 and an isolation insulating film 10, and that no collector wall region is formed in the present embodiment. Besides the above differences, the structure is similar to the BiNMOS of the first embodiment shown in FIG. 1.

Figure 18:
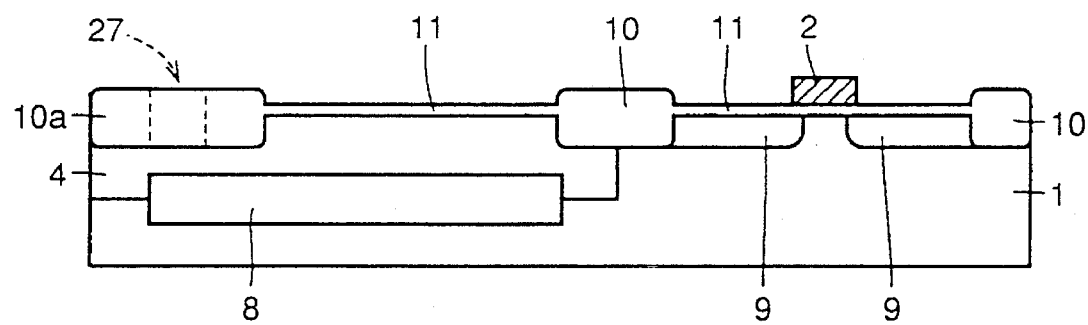
FIGS. 18 to 20 are cross sectional views illustrating the third to fifth steps in the manufacturing process of the BiNMOS of the fourth embodiment in accordance with the present invention.
Figure 19:
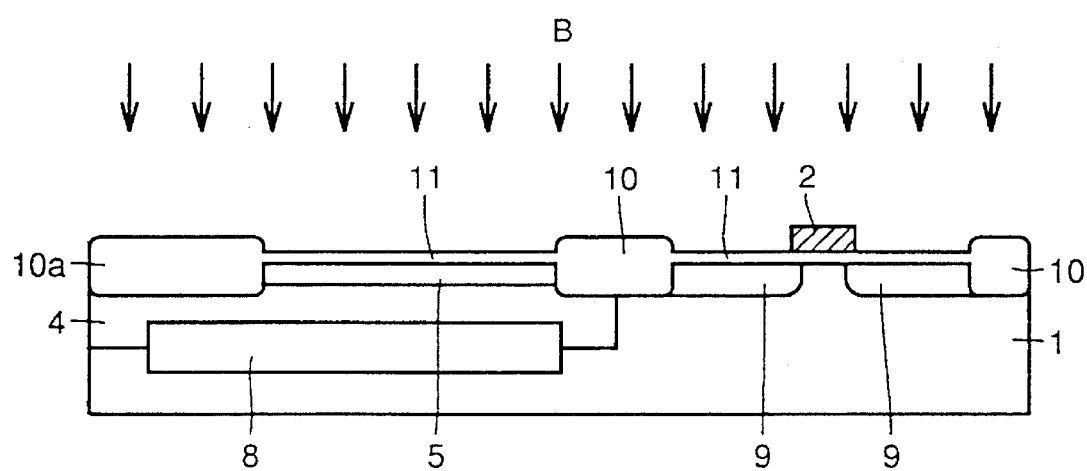
Figure 20:
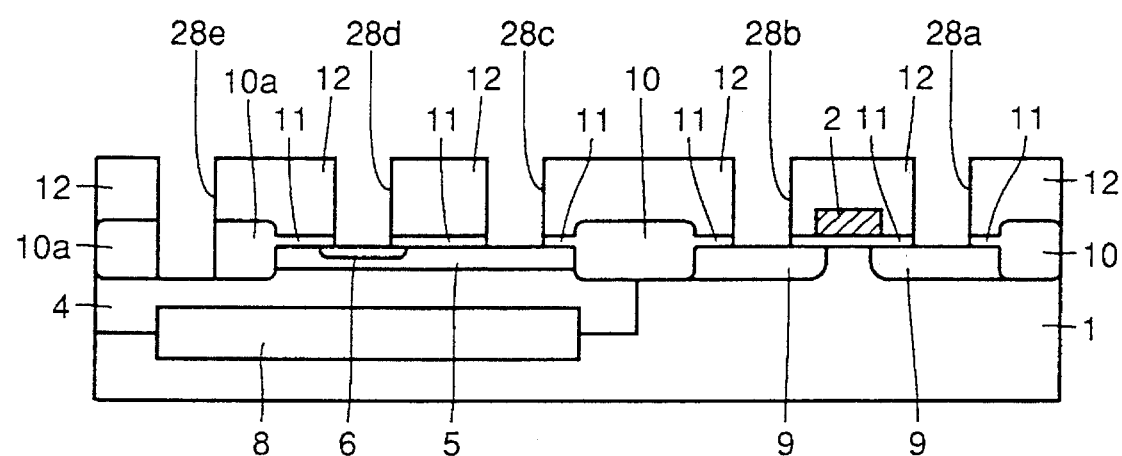

Referring now to FIGS. 18 to 20, the manufacturing method of the BiNMOS shown in FIG. 17 will be described. FIGS. 18 to 20 are cross sectional views illustrating the third to fifth steps in the process for manufacturing BiNMOS of the fourth embodiment in accordance with the present invention.

Referring to FIG. 18, through a process similar to that of the conventional example described previously, there are formed a collector region 4 and a floating collector region 8. Using the LOCOS method, isolation insulating films 10, 10a are formed selectively on a main surface of a p type semiconductor substrate 1. At this time, isolation insulating film 10a is formed to cover also a region 27 where a collector electrode is to be formed. Then, by a method similar to the conventional example, a gate electrode 2 and n type impurity regions 9, 9 are formed.

Referring next to FIG. 19, a p type impurity such as boron (B) is implanted into the entire main surface of p type semiconductor substrate 1 with a condition similar to that of the first embodiment described previously. Thus, a p type base region 5 is formed in the surface portion of collector region 4.

At this time, region 27 where the collector electrode is to be formed is covered by isolation insulating film 10a so that the p type impurity would not be implanted into collector region 4 under region 27 where the collector electrode is to be formed. Accordingly, formation of a collector wall region can be omitted. Furthermore, unlike the second and third embodiments described above, p type impurity region would not be formed under the region where a collector electrode is to be formed. Therefore, compared to the above-described second and third embodiments, the condition for the implantation of boron (B) for forming the base region can be selected more freely.

Referring now to FIG. 20, interlayer insulating film 12 is formed entirely on the main surface of p type semiconductor substrate 1. In this interlayer insulating film 12, contact holes 28a, 28b, 28c, 28d, and 28e are formed at the regions located on n type impurity regions 9, 9, surface of a portion of base region 5, surface of a portion of emitter region 6, and region where a collector electrode is to be formed, respectively. At this time, contact hole 28e is formed on the region where collector electrode is to be formed, penetrating isolation insulating film 10a and interlayer insulating film 12. Thereafter, through a process similar to the first embodiment described previously, the BiNMOS shown in FIG. 17 is formed.

As in the first embodiment described above, the manufacturing cost can be reduced in the manufacturing method of the present embodiment compared to the conventional example. In addition, formation of the collector wall region can be omitted in the present embodiment, although contact resistance between collector region 4 and collector electrode 13e increases to some extent compared to each embodiment described above. However, since the step of forming the collector wall region can also be omitted, the manufacturing cost can be reduced further, compared to the above-described first embodiment. In addition, it is also possible to improve the characteristics of the device in the present embodiment by forming SAC layers 23 as in the above-described third embodiment.

Fifth Embodiment

Referring now to FIGS. 21 to 28, a fifth embodiment in accordance with the present invention will be described. The present embodiment has been devised to solve a problem which is likely to be encountered in BiNMOS of the fourth embodiment described above.

Figure 21:
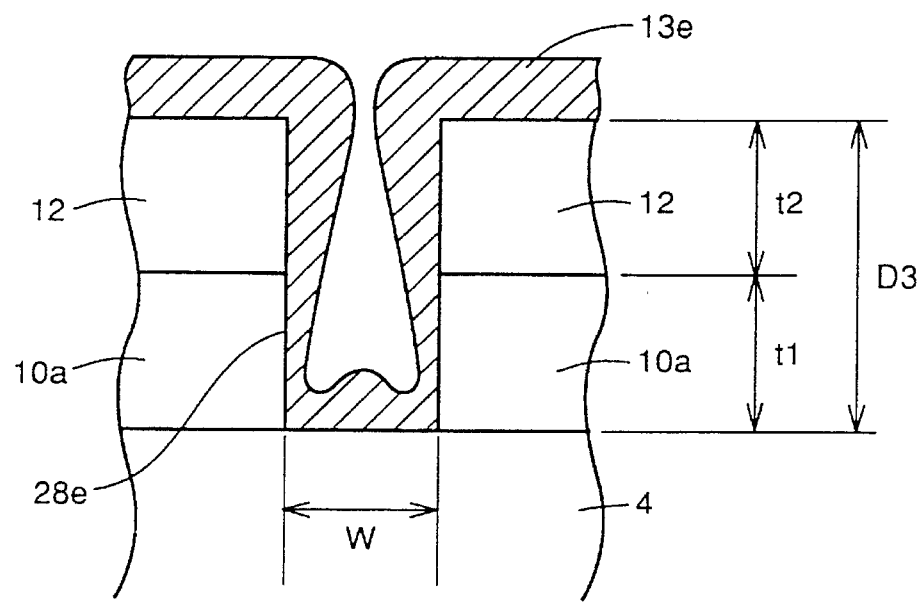
FIG. 21 shows an enlarged cross section in the vicinity of the collector electrode in FIG. 17.
Figure 22:
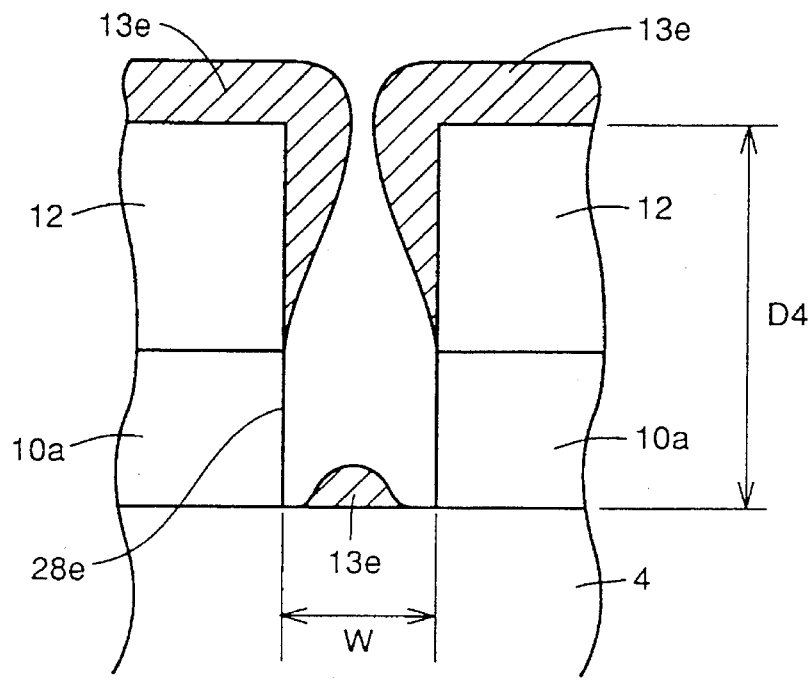
FIG. 22 is an illustration of a problem which is likely to be encountered in the fourth embodiment.

FIG. 21 shows an enlarged cross section in the vicinity of contact hole 28e in FIG. 17. FIG. 22 is a cross sectional view illustrating the disconnection of metal electrode 13e within contact hole 28e caused by the increased aspect ratio of contact hole 28e.

Referring to FIG. 21, opening width W of contact hole 28e is approximately 0.75 µm. Thickness t1 of isolation insulating film 10a is about 3000Å to about 7000Å. In addition, thickness t2 of interlayer insulating film 12 should be limited to about 8000Å. Then, the depth D3 of contact hole 28e will be approximately 1.5 µm. This means that the aspect ratio of contact hole 28e would be approximately 2.

When the aspect ratio of contact hole 28e is about 2 at most, it becomes more likely that metal electrode 13e would be formed within contact hole 28e without disconnection.

However, since metal electrode 13e is generally formed by sputtering, its step coverage may not be satisfactory. If this metal electrode 13e is to be formed in contact hole 28e without any disconnection, it is conceived that the aspect ratio of this contact hole 28e should be not more than about 2, which is the critical value. In addition, since other contact holes 28a to 28d in FIG. 17 is shallower than contact hole 28e, the aspect ratio of contact holes 28a to 28d is lower than that of contact hole 28e.

In contrast to that, when BiNMOS according to the present invention is formed in a peripheral circuitry of a memory device such as DRAM, interlayer insulating film 12 would be thicker and the depth D4 of contact hole 28e would possibly be as deep as about 1.8 µm or more.

In that case, the aspect ratio of contact hole 28e would be as high as about 2.4, since the opening width W of contact hole 28e is 0.75 µm. When the aspect ratio of contact hole 28e is as high as about 2.4 as in this example, it becomes highly possible that metal electrode 13e would be disconnected within contact hole 28e.

Figure 23:
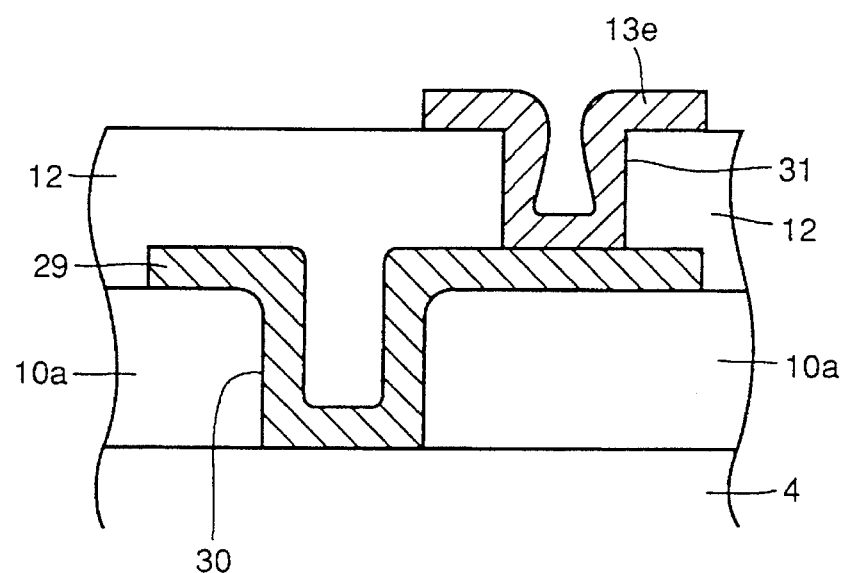
FIG. 23 is an illustration of a method for solving the problem shown in FIG. 22.

A possible method to prevent this problem is shown in FIG. 23. FIG. 23 is an illustration of a method which may be used to solve the above-described problem. Referring to FIG. 23, a contact hole 30 is formed which penetrates only an isolation insulating film 10a. Then, a polycrystalline silicon pad 29 is formed such that it extends in this contact hole 30 and on isolation insulating film 10a. Covering this polycrystalline silicon pad 29, an interlayer insulating film 12 is formed. In this interlayer insulating film 12, a contact hole 31 is formed, and within this contact hole 31 and on interlayer insulating film 12 a metal electrode 13e is formed.

In the above structure shown in FIG. 23, polycrystalline silicon layer 29 is well-suited to be used as a pad layer because of its good coverage. However, this polycrystalline silicon layer 29 has higher resistance, compared to metals such as aluminum Al or the like. Accordingly, by providing a double-layered structure as a collector electrode as shown in FIG. 23, which structure consisting of polycrystalline silicon pad 29 and metal electrode (Al electrode) 13e, the resistance can be made lower than when collector electrode is formed only of polycrystalline silicon layer.

However, the structure shown in FIG. 23 requires additional steps of photolithography and etching to form polycrystalline silicon layer 29 and a step of forming contact hole 30, increasing the number of steps. Accordingly, a polycrystalline electrode for lead-out from the source/drain regions of the MOS transistor and the above-described polycrystalline silicon pad 29 should be formed in one step. The following description for the present embodiment is based on the assumption that the formation of the electrode for lead-out from the source/drain regions is a matter of course.

FIGS. 24 to 27 are cross sectional views showing the eighth to eleventh steps in the process for manufacturing a BiNMOS of the fifth embodiment in accordance with the present invention.

Figure 24:
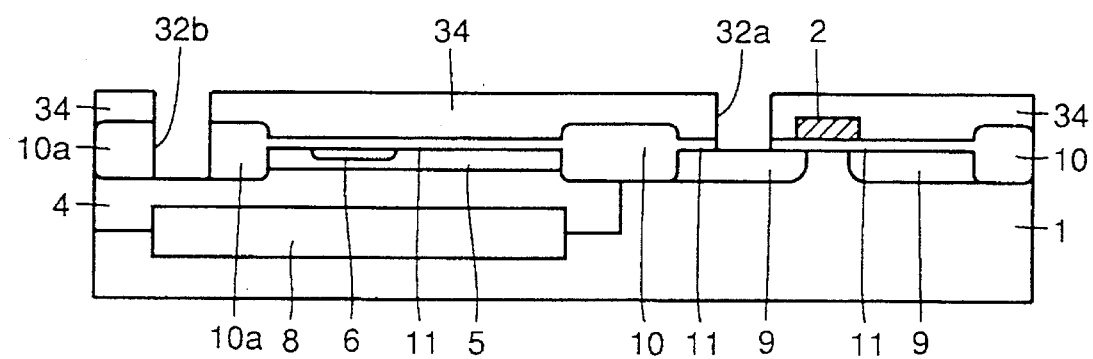
FIGS. 24 to 27 are cross sectional views illustrating the fifth to eighth steps in the manufacturing process of the BiNMOS of the fifth embodiment in accordance with the present invention.
Figure 25:
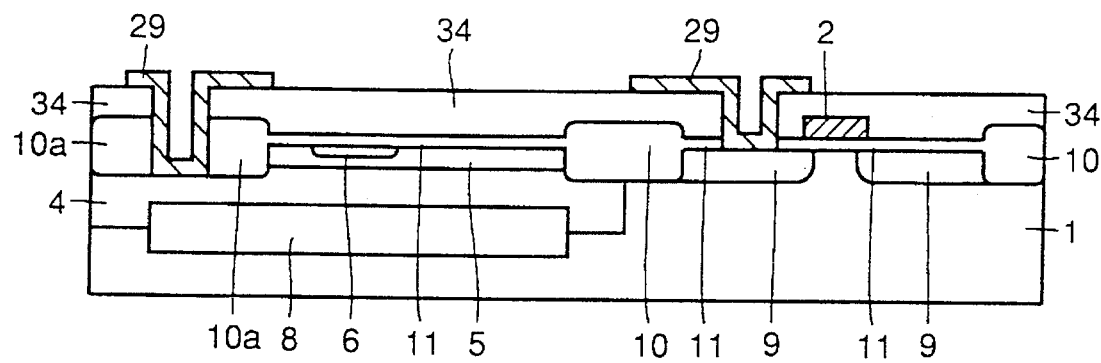

Referring to FIG. 24, a process similar to the above-described fourth embodiment is carried on until a gate electrode 2 is formed. Then, an interlayer insulating film 34 is deposited entirely on the main surface of a p type semiconductor substrate 1 by, for example, CVD method. Contact hole 32b penetrating an isolation insulating film 10a and interlayer insulating film 34 at the region where a collector electrode is to be formed, and contact hole 32a penetrating interlayer insulating film 34 on one of the n type impurity regions 9 are formed respectively. Contact holes may also be formed on both n type impurity regions 9, 9.

Then, by CVD, polycrystalline silicon layers 29 are formed in which an impurity is introduced. This polycrystalline silicon layer 29 is patterned to a predetermined shape, thereby forming a polycrystalline silicon pad 29.

Figure 26:
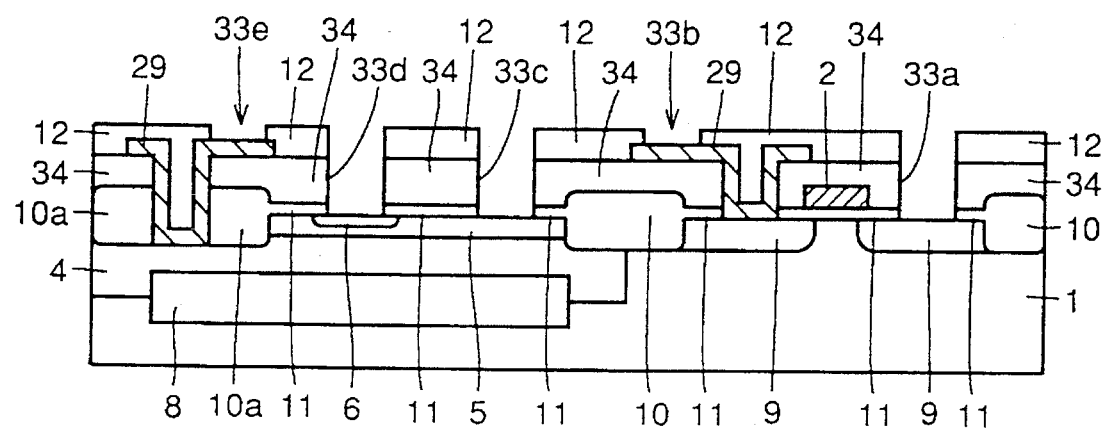

Referring now to FIG. 26, an interlayer insulating film 12 is deposited by CVD, so as to cover polycrystalline silicon layers 29 and interlayer insulating film 34. Then, contact holes 33a, 33b, 33c, 33d, and 33e are formed respectively, which penetrate both interlayer insulating films 12 and 34 on an emitter region 6, a base region 5 and one of n type impurity regions 9, 9, and interlayer insulating film 12 on polycrystalline silicon layers 29.

At this time, interlayer insulating films 34 and 12 are stacked on emitter region 6, base region 5 and one of n type impurity region 9. However, by adjusting the thicknesses of these interlayer insulating films 12 and 34, the aspect ratio of contact holes 33a, 33c, and 33d can be made no higher than about 2.

Figure 27:
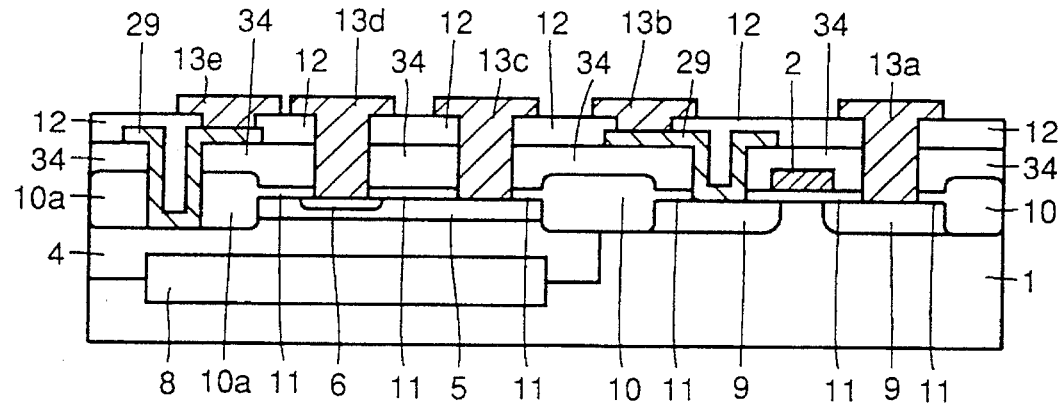

Referring now to FIG. 27, metal electrodes (Al electrodes) 13a, 13b, 13c, 13d, and 13e are formed respectively in contact holes 33a, 33b, 33c, 33d, and 33e, by sputtering or the like. Since the aspect ratio of each of the contact holes 33a to 33e is made no higher than about 2, disconnection of metal electrodes 13a to 13e can be prevented.

Figure 28:
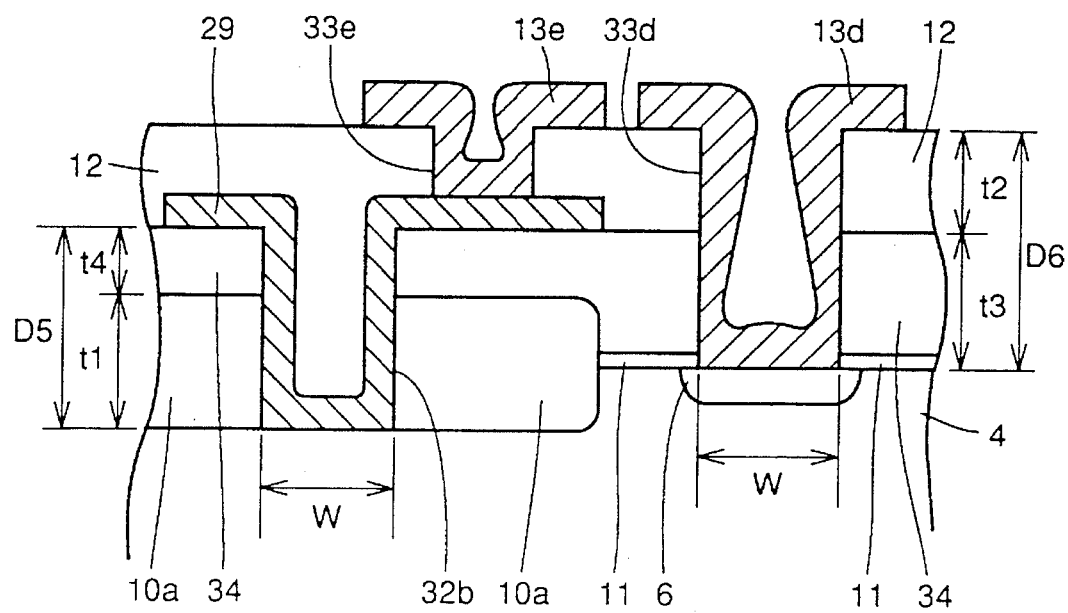
FIG. 28 shows an enlarged cross section in the vicinity of a collector electrode in FIG. 27.
Figure 29:
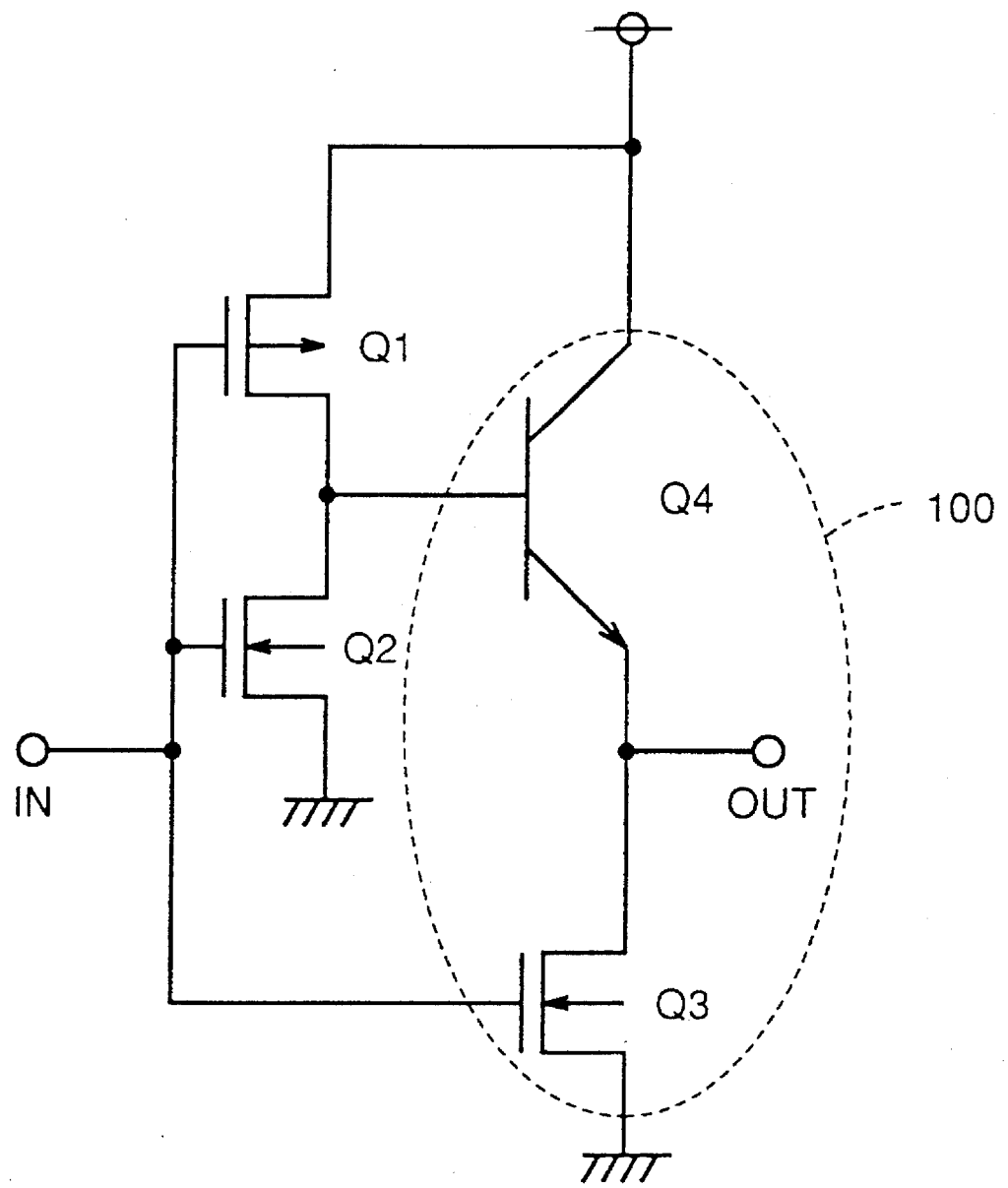
FIG. 29 is an equivalent circuit diagram showing an example of a circuit including a conventional BiNMOS.

FIG. 28 is an enlarged cross section in the vicinity of the region where collector electrode is to be formed. Referring to FIG. 28, structure in the vicinity of the region where the collector electrode is to be formed will be described in more detail. Referring to FIG. 28, in the present embodiment, aspect ratio of each contact hole can be made no higher than 2. Thus, it is possible to improve the reliability compared to the above-described fourth embodiment.

In particular, thickness t1 of isolation insulating film 10a is about 3000Å to about 7000Å. Thickness t3 of interlayer insulating film 34 varies depending on where the film is formed, but on emitter region 6, it would be approximately 1 μm.

Then, thickness t4 of interlayer insulating film 34 on isolation insulating film 10a would be 1 μm or less. Accordingly, depth D5 of contact hole 32b would be no more than 1.7 μm. The opening width W of contact hole 32b is approximately no more than 0.75 μm. Accordingly, the aspect ratio of a contact hole 32b would be approximately 2.2 at most. However, disconnection is not likely to occur because there is polycrystalline silicon pad 29 formed in this contact hole 32b.

On interlayer insulating film 34, interlayer insulating film 12 is formed. Thickness of this interlayer insulating film 12 varies from device to device, but if thickness t2 of this interlayer insulating film 12 is made no more than about 5000Å, depth D6 of a contact hole 33d can be made approximately no more than 1.5 μm.

Here again, the opening width W of contact hole 33d is about 0.75 μm. Therefore, the aspect ratio of this contact hole 33d can be made approximately no higher than 2. As for contact hole 33e, since it penetrates interlayer insulating film 12 only, the aspect ratio is made low.

As described above, the aspect ratio of a desired contact hole can be adjusted by providing the interlayer insulating film as a double-layered structure and adjusting thickness thereof appropriately. In this way, the aspect ratio of a desired contact hole can be kept low, thereby improving the reliability of the contact portion.

In the present embodiment, more interlayer insulating films and more contact holes are formed, compared to each of the embodiments described previously. Accordingly, steps of manufacturing has been increased. However, the manufacturing process as in the present embodiment would be inevitable to retain the reliability of the device if, for example, the aspect ratio of a contact hole in the region where a collector electrode is to be formed happens to be very high, within which contact hole is formed the collector electrode.

In such a case, it is conceived that a process as complex as in the present embodiment is also required even in the conventional example. In this event, as in the first embodiment described above, the step of forming a resist pattern can be omitted in the present embodiment in forming base region 5 of the bipolar transistor, in contrast to the conventional example. Accordingly, reduction in the manufacturing costs is made possible.

Although the present invention is applied to a BiNMOS in each of the above-described embodiments, the present invention is also applicable to a BiPMOS or a BiCMOS. Further, in each of the above embodiments, the p type and the n type may be exchangeable. In addition, the present invention is also applicable to such a semiconductor device that includes on the same substrate a bipolar transistor and impurity regions, including different conductivity type impurity than those included in base region of this bipolar transistor, and formed at regions other than this bipolar transistor is formed. Further, in above embodiments, it is needless to say that heat treatments are carried out.

Based upon the foregoing, in accordance with the present invention, steps of photolithography for forming a base region can be omitted in the manufacturing process of a semiconductor device having a bipolar transistor. Accordingly, the number of manufacturing steps can be reduced.

Further, when a collector wall region of a bipolar transistor and source/drain regions of the MOS transistor are formed in one step, the manufacturing process can be further simplified. Accordingly, the manufacturing costs can be further reduced.

Further, when an isolation insulating layer is formed to cover a region where a collector electrode is to be formed, the impurity for forming the base region would not be implanted into the contact portion between the collector electrode and the collector region. In this event, formation of the collector wall region can be omitted. When formation of the collector wall region is omitted in this way, the manufacturing process of a semiconductor device having a bipolar transistor can be simplified further. As a result, the manufacturing cost is further reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate having a main surface;

an MOS transistor formed in the main surface and having source/drain regions of a second conductivity type; and a bipolar transistor formed in the main surface and having a base region of a first conductivity type; wherein said source/drain regions include an impurity of the first conductivity type with a peak concentration equal to the peak concentration of the impurity of the first conductivity type in said base region;

the peak concentration of the impurity of the first conductivity type in said source/drain regions is no greater than one tenth the peak concentration of the impurity of the second conductivity type in said source/drain regions;

the peak concentration of the impurity of the first conductivity type in said source/drain regions is at least $10^{18}$ cm$^{-3}$.

2. The semiconductor device according to claim 1, wherein a metal electrode is formed on a surface of a portion of said base region.

3. The semiconductor device according to claim 1, wherein said bipolar transistor comprises:
a collector region of the second conductivity type;
a collector electrode; and
a collector wall region of the second conductivity type formed in contact with the collector electrode and overlapping a portion of said collector region, wherein the collector wall region contains an impurity of the first conductivity type having a peak concentration equal to the peak concentration of the impurity of the first conductivity type in said base region.

4. The semiconductor device according to claim 3, wherein said collector wall region and said source/drain regions have an equal diffusion depth, a portion of the collector region is located under the collector wall region and the peak concentration of the impurity of the second conductivity type in the collector region under the collector wall region is less than $10^{18}$ cm$^{-3}$.

5. The semiconductor device according to claim 3, wherein a portion of the collector region is located under the collector wall region;

an impurity region of the second conductivity type is formed at a junction interface of a collector electrode and said collector wall region, and overlapping both said collector wall region and said portion of said collector region under said collector wall region;

the peak concentration of the impurity of the first conductivity type in said impurity region is equal to the peak concentration of the impurity of the first conductivity type in said base region; and the peak concentration of the impurity of the second conductivity type in the collector region under the collector wall region is less than $10^{18}$ cm$^{-3}$.

6. A semiconductor device comprising:

a bipolar transistor formed in a main surface of a semiconductor substrate and having a base region of a first conductivity type containing an impurity of a first conductivity type; and an MOS transistor formed in said main surface of said semiconductor substrate and having a pair of source/drain regions of a second conductivity type each containing an impurity of the first conductivity type and an impurity of the second conductivity type; wherein the maximum concentration of the impurity of the first conductivity type in said base region is greater than $10^{18}$ cm$^{-3}$ and no greater than one tenth the maximum concentration of the impurity of the second conductivity type in said source/drain regions; and the maximum concentration of the impurity of the first conductivity type in said source/drain regions is greater than $10^{18}$ cm$^{-3}$ and no greater than one tenth the maximum concentration of the impurity of the second conductivity type in said source/drain regions.

7. A semiconductor device comprising:

a semiconductor substrate having a main surface;

an MOS transistor formed in said main surface and having source/drain regions of a second conductivity type; and a bipolar transistor formed in said main surface and having a base region of a first conductivity type and a collector region of the second conductivity type; wherein said source/drain regions contain an impurity of the first conductivity type with a peak concentration equal to the peak concentration of the impurity of the first conductivity type in said base region;

the peak concentration of the impurity of the first conductivity type in said source/drain regions is no greater than one tenth the peak concentration of the impurity of the second conductivity type in said source/drain regions;

a collector wall region of the second conductivity type is formed in the surface of said collector region;

said collector wall region and said source/drain regions have an equal diffusion depth;

a portion of the collector region is located under the collector wall region; and the peak concentration of the impurity of the second conductivity type in the collector region under the collector wall region is less than $10^{18}$ cm$^{-3}$.

8. A semiconductor device comprising:

a semiconductor substrate having a main surface;

an MOS transistor formed in said main surface and having source/drain regions of a second conductivity type; and a bipolar transistor formed in said main surface and having a base region of a first conductivity type and a collector region of the second conductivity type; wherein said source/drain regions contain an impurity of the first conductivity type with a peak concentration equal to the peak concentration of the impurity of the first conductivity type in said base region and is no greater than one tenth the peak concentration of the impurity of the second conductivity type in said source/drain regions;

a collector wall region of the second conductivity type is formed in the surface of said collector region;

a portion of the collector region is located under the collector wall region;

an impurity region of the second conductivity type is formed at a junction interface of a collector electrode and said collector wall region, and overlapping both said collector wall region and said portion of said collector region under said collector wall region;

the peak concentration of the impurity of the first conductivity type in said impurity region is equal to that of the impurity of the first conductivity type in said base region; and the peak concentration of the impurity of the second conductivity type in the collector region under the collector wall region is less than $10^{18}$ cm$^{-3}$.

* * * * *